US012581660B2

(12) United States Patent
Park et al.

(10) Patent No.: US 12,581,660 B2
(45) Date of Patent: Mar. 17, 2026

(54) SEMICONDUCTOR MEMORY DEVICES

(71) Applicant: SAMSUNG ELECTRONICS CO., LTD., Suwon-si (KR)

(72) Inventors: Kyu Dong Park, Suwon-si (KR); Jong Hyun Paek, Suwon-si (KR); Seul Ji Song, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 435 days.

(21) Appl. No.: 18/175,923

(22) Filed: Feb. 28, 2023

(65) Prior Publication Data

US 2023/0371283 A1    Nov. 16, 2023

(30) Foreign Application Priority Data

May 11, 2022    (KR) ........................ 10-2022-0057658

(51) Int. Cl.
   *H10B 63/00*        (2023.01)
   *H10B 63/10*        (2023.01)
(52) U.S. Cl.
   CPC ............. *H10B 63/80* (2023.02); *H10B 63/10* (2023.02)
(58) Field of Classification Search
   CPC ...................................................... H10B 63/80
   See application file for complete search history.

(56) References Cited

U.S. PATENT DOCUMENTS

| | | | |
|---|---|---|---|
| 9,385,318 | B1 | 7/2016 | Henri |
| 10,050,194 | B1 | 8/2018 | Nardi et al. |
| 10,424,730 | B2 | 9/2019 | Pirovano et al. |
| 10,693,065 | B2 | 6/2020 | Redaelli et al. |
| 10,763,307 | B1 | 9/2020 | Carta et al. |
| 11,031,543 | B2 | 6/2021 | Liao et al. |
| 2012/0068136 | A1* | 3/2012 | Park ..................... H10N 70/231 |
| | | | 257/3 |
| 2015/0287916 | A1* | 10/2015 | Campbell ............ H10N 70/826 |
| | | | 438/763 |
| 2018/0205017 | A1* | 7/2018 | Bruce .................... H10B 63/84 |

(Continued)

FOREIGN PATENT DOCUMENTS

| | | |
|---|---|---|
| CN | 112655093 A | 4/2021 |
| KR | 2019-0044780 A | 5/2019 |

(Continued)

*Primary Examiner* — Mounir S Amer
(74) *Attorney, Agent, or Firm* — Wolf, Greenfield & Sacks, P.C.

(57)    ABSTRACT

A semiconductor memory device comprises a substrate, a first conductive line extending in a first direction on the substrate, a second conductive line extending in a second direction on the first conductive line, a memory cell between the first and the second conductive lines, and a spacer covering a part of a side wall of the memory cell, wherein the memory cell includes a first electrode connected to the first conductive line, a second electrode connected to the second conductive line, and an information storage pattern between the first and second electrodes, wherein the spacer covers a side wall of the information storage pattern and a side wall of the second electrode, but not side walls of the first electrode, and the first electrode is wider than the information storage pattern at a portion on which the first electrode and the information storage pattern contact to each other.

20 Claims, 21 Drawing Sheets

(56) References Cited

U.S. PATENT DOCUMENTS

| 2019/0109176 | A1* | 4/2019 | Sciarrillo ............... H10B 63/20 |
| 2020/0411757 | A1* | 12/2020 | Kim ..................... H10N 70/231 |
| 2021/0202841 | A1 | 7/2021 | Good et al. |
| 2021/0233768 | A1 | 7/2021 | Sarkar et al. |

FOREIGN PATENT DOCUMENTS

| KR | 2019-0131599 | A | 11/2019 |
| KR | 2021-0152840 | A | 12/2021 |

* cited by examiner

SEMICONDUCTOR MEMORY DEVICES

CROSS-REFERENCE TO RELATED APPLICATION

This application claims priority under 35 U.S.C. § 119 to Korean Patent Application No. 10-2022-0057658 filed on May 11, 2022, in the Korean Intellectual Property Office, and all the benefits accruing therefrom and the contents of which in its entirety are herein incorporated by reference.

BACKGROUND

The present disclosure relates to semiconductor memory devices.

Semiconductor memory devices are widely used to store information in various electronic devices, for example, computers, wireless communication devices, cameras, digital displays, and the like. Information may be stored by programming different states in semiconductor memory devices. For example, a semiconductor memory device may have two states marked by logic "1" or logic "0". Components of an electronic device may read or sense a stored state in the semiconductor memory device to access stored information. The components of the electronic device may write or program a state in the semiconductor memory device to store information.

Semiconductor memory devices may include magnetic hard disks, random access memories (RAMs), dynamic RAMs (DRAMs), synchronous dynamic RAMs (SDRAMs), ferroelectric RAMs (FeRAMs), magnetic RAMs (MRAMs), resistive RAMs (RRAMs), read-only memories (ROMs), flash memories, phase change memories (PCMs), and others. Semiconductor memory devices may be volatile or non-volatile. A non-volatile memory, for example, a FeRAM, may keep stored logic states of the memory for an extended period of time, even in the absence of an external power source. A volatile memory, for example, a DRAM, may lose logic states stored therein over time if the volatile memory is not periodically refreshed by an external power source. Improvements in semiconductor memory devices may include increasing the density of memory cells based on different measurement standards, increasing read/write speeds, increasing reliability, increasing data retention, decreasing power consumption, or decreasing manufacturing costs.

Some types of semiconductor memory devices may use changes in the polarity of the voltage applied to memory cells to program and sense different logic states. For example, a self-selecting memory may improve threshold voltage differences among memory cells programmed in different states. The way of programming the memory cells may affect the distribution of various materials that the memory cells comprise. This may affect the ion mobility of the memory cells and ultimately affect the threshold voltages of the memory cells. The threshold voltages may be related to the logic states of the memory cells. Therefore, small changes in threshold voltages between different logic states may affect the accuracy with which memory cells may be read.

SUMMARY

Various embodiments of the present disclosure provide a semiconductor memory device having improved reliability. However, the present disclosure is not restricted to improving device reliability. The above and other aspects of the present disclosure will become more apparent to one of ordinary skill in the art to which the present disclosure pertains by referencing the detailed description of the present disclosure given below.

According to an example embodiment, a semiconductor memory device comprises a substrate, a first conductive line extending in a first horizontal direction parallel to an upper surface of the substrate, on the substrate, a second conductive line extending in a second horizontal direction parallel to the upper surface of the substrate, which is intersecting the first horizontal direction, on the first conductive line, a memory cell placed at an intersection of the first conductive line and the second conductive line, between the first conductive line and the second conductive line, and a spacer which covers a part of a side wall of the memory cell, wherein the memory cell includes a first electrode connected to the first conductive line, a second electrode connected to the second conductive line, and an information storage pattern placed between the first electrode and the second electrode, wherein the spacer covers one or more side walls of the information storage pattern and one or more side walls of the second electrode and does not cover side walls of the first electrode, and a width of the first electrode in the first horizontal direction is greater than a width of the information storage pattern in the first horizontal direction at a portion on which the first electrode and the information storage pattern are in contact with each other.

According to another example embodiment, a semiconductor memory device comprises a substrate, a first conductive line extending in a first horizontal direction parallel to an upper surface of the substrate, on the substrate, a second conductive line extending in a second horizontal direction parallel to the upper surface of the substrate, which is intersecting the first horizontal direction, on the first conductive line, a first electrode connected to the first conductive line at an intersection of the first conductive line and the second conductive line, an information storage pattern on the first electrode, a second electrode being in contact with the second conductive line on the information storage pattern, a first sub-spacer, which covers one or more side walls of the information storage pattern, one or more side walls of the second electrode, and an upper surface of the first electrode, and a second sub-spacer on the first sub-spacer, wherein a surface area of the upper surface of the first electrode is greater than a surface area of a bottom surface of the information storage pattern at a portion on which the first electrode and the information storage pattern are in contact with each other, a surface area of a bottom surface of the second electrode is greater than a surface area of an upper surface of the information storage pattern at a portion on which the information storage pattern and the second electrode are in contact with each other, and the first and second sub-spacers include different materials from each other.

According to another example embodiment, a semiconductor memory device comprises, a substrate, a first conductive line extending in a first horizontal direction parallel to an upper surface of the substrate, on the substrate, a second conductive line extending in a second horizontal direction parallel to the upper surface of the substrate, which is intersecting the first horizontal direction, on the first conductive line, a third conductive line extending in the first horizontal direction on the second conductive line, a first memory cell placed at an intersection of the first conductive line and the second conductive line, between the first conductive line and the second conductive line, a second memory cell placed at an intersection of the second conductive line and the third conductive line, between the second conductive line and the third conductive line, a first spacer which covers a part of one or more side walls of the first memory cell, and a second spacer which covers a part of one or more side walls of the second memory cell, wherein the first memory cell includes a first electrode connected to the first conductive line, a second electrode connected to the second conductive line, and a first information storage pattern placed between the first electrode and the second electrode, wherein the first spacer covers one or more side walls of the first information storage pattern and one or more side walls of the second electrode, and does not cover side walls of the first electrode, a width of the first electrode in the first horizontal direction is greater than a width of the first information storage pattern in the first horizontal direction at a portion on which the first electrode and the first information storage pattern are in contact with each other, wherein the second memory cell includes a third electrode connected to the second conductive line, a fourth electrode connected to the third conductive line, and a second information storage pattern placed between the third electrode and the fourth electrode, wherein the second spacer covers one or more side walls of the second information storage pattern and one or more side walls of the fourth electrode, and does not cover side walls of the third electrode, and a width of the third electrode in the first horizontal direction is greater than a width of the second information storage pattern in the first horizontal direction at a portion on which the third electrode and the second information storage pattern are in contact with each other.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

A method of operating a semiconductor memory device according to some embodiments will be described below referring to FIG. 1. Although the semiconductor memory device according to some embodiments is shown as a self-selecting memory (SSM), embodiments of the present disclosure are not limited thereto. The semiconductor memory device according to some embodiments may be a phase-change random access memory (PRAM).

Figure 1:
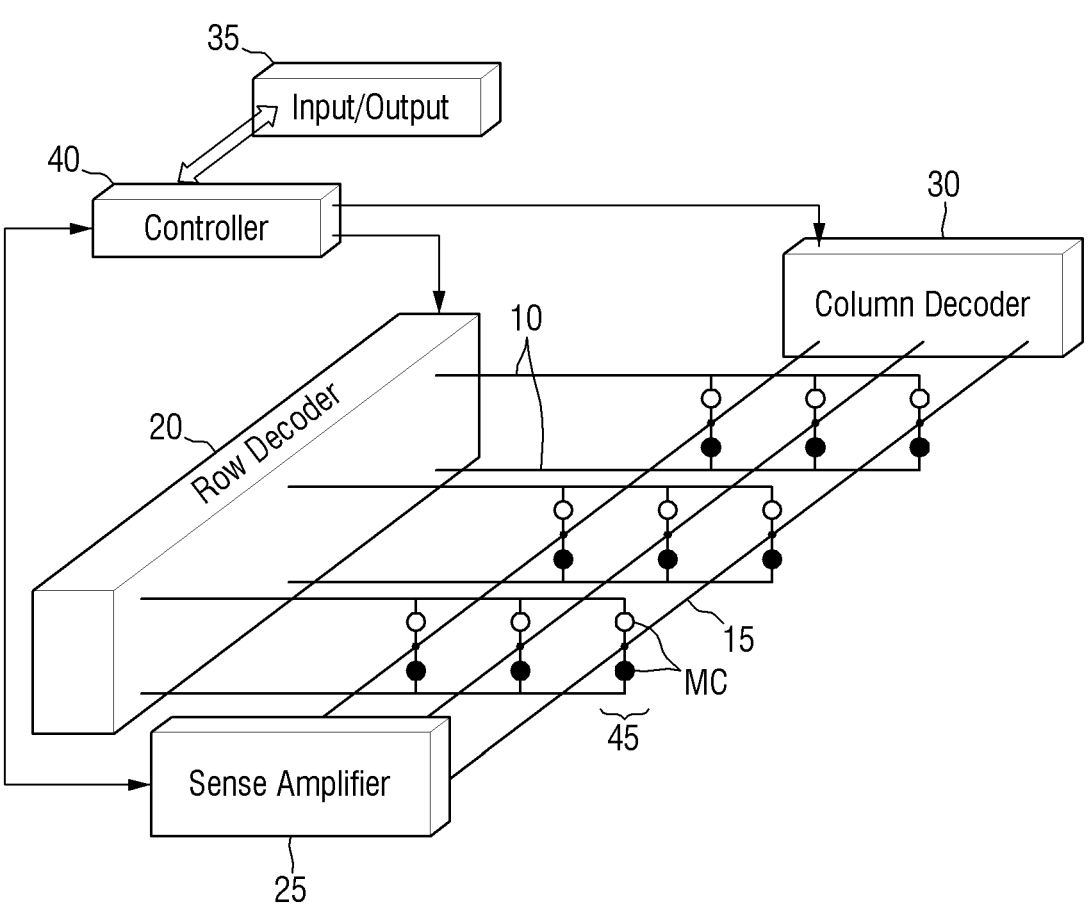
FIG. 1 is a diagram illustrating a method of operating a semiconductor memory device according to some embodiments.

FIG. 1 is a diagram illustrating a method of operating a semiconductor memory device according to some embodiments.

Referring to FIG. 1, the semiconductor memory device according to some embodiments may include at least one or more memory cells MC. Each memory cell MC may be programmable to store two states marked by logic "0" and logic "1". In some embodiments, the memory cell MC may store more than two logic states.

The memory cell MC may include an information storage pattern indicating a logic state. The information storage pattern may include a chalcogenide material. The chalcogenide material may have a variable threshold voltage or a variable resistivity. The chalcogenide material may include a compound in which at least one of various chalcogen elements, such as sulfur (S), tellurium (Te), or selenium (Se), is combined with at least one of germanium (Ge), antimony (Sb), bismuth (Bi), aluminum (Al), thallium (Tl), tin (Sn), zinc (Zn), arsenic (As), silicon (Si), indium (In), titanium (Ti), gallium (Ga), or phosphorus (P).

In some embodiments, the threshold voltage of memory cell MC may be variable depending on the polarity used to program the memory cell MC. For example, a self-selecting memory cell programmed with one polarity may have one threshold voltage in accordance with a particular resistivity. The self-selecting memory cell may be programmed with different polarities that may generate different threshold voltages from each other in accordance with the different resistivity characteristics of the self-selecting memory cell caused by the different polarities. When the self-selecting memory cell is programmed, ions in the chalcogenide material may move. The ions may move toward a particular electrode according to the polarity with which the self-selecting cell is programmed. For example, in the self-selecting memory cell, the ions may move toward a negative electrode. The self-selecting memory cell may then be read by applying a voltage to the self-selecting memory cell to detect to which electrode the ions have moved adjacent.

In some embodiments, the threshold voltage of the memory cell MC may be adjusted by using the crystal structure or atomic arrangement of the chalcogenide material. For example, a material with a crystalline atomic arrangement may have different resistivity from the resistivity of the same material with an amorphous atomic arrangement. A crystalline state may have lower resistivity. An amorphous state may have higher resistivity. Therefore, the voltage applied to the memory cell MC may generate different currents depending on whether the chalcogenide material is in a crystalline state or an amorphous state. The magnitude of the generated current may then indicate the logic state stored in the memory cell MC.

A memory array of the semiconductor memory device according to some embodiments may be configured two-dimensionally (2D) or may be configured three-dimensionally (3D). The three-dimensional (3D) memory array may have a structure in which memory cells MC are vertically stacked. The three-dimensional memory array may increase the number of memory cells MC formed on one substrate compared to the two-dimensional memory array. As shown in FIG. 1, a three-dimensional memory array may include two layers of memory cells MC. However, embodiments of the present disclosure are not limited thereto. The memory cells MC may be aligned over each layer. A memory cell stack 45 may comprise the memory cells MC.

Each row of the memory cell MC may be connected to a first conductive line 10 and a second conductive line 15. Although the first conductive line 10 may be a word line, and the second conductive line 15 may be a bit line, the present disclosure is not limited thereto. The first conductive line 10 and the second conductive line 15 may extend substantially perpendicular to each other.

In some embodiments, a memory cell MC may be placed at an intersection between the first conductive line 10 and the second conductive line 15. The intersection may be referred to as an address of the memory cell MC. A target memory cell MC may be located at the intersection between the word line and the bit line to which the voltage is applied. That is, the first conductive line 10 and the second conductive line 15 may function to read and write the memory cell MC at the intersection.

In some embodiments, reading and writing may include application of voltage or current to each conductive line. By activating or selecting the first conductive line 10 and the second conductive line 15, reading and writing may be performed on the memory cell MC. The first conductive line 10 and the second conductive line 15 may include a conductive material. For example, the first conductive line 10 and the second conductive line 15 may include metals such as copper (Cu), aluminum (Al), gold (Au), tungsten (W), and titanium (Ti), metal alloys, carbon, conductively doped semiconductor materials, and/or other conductive materials. When the memory cell MC is selected, it may be affected, for example, to set the logic state of the cell, which is mobility of selenium (Se) ions.

For example, the memory cell MC may be programmed by applying an electrical pulse to the chalcogenide material including selenium (Se). The pulse may be applied, for example, through the first conductive line 10 or the second conductive line 15. When the pulse is applied, the selenium (Se) ions may move toward a particular electrode inside the information storage pattern according to the polarity of the memory cell MC. Therefore, the concentration of selenium (Se) ion on the surface of the information storage pattern may be affected by the voltage polarities of the first conductive line 10 and the second conductive line 15.

A voltage may be applied to the memory cell MC to read the cell. A threshold voltage of the memory cell MC at which the current generated through the voltage application starts to flow may represent the state of logic "1" or logic "0". The difference in concentration of selenium (Se) ions at the end of the information storage pattern may affect the threshold voltage. The difference in concentration of selenium (Se) ions at the end of the information storage pattern may generate a greater difference in cell response between the logic states.

Access to the memory cell MC may be controlled through a row decoder 20 and a column decoder 30. For example, the row decoder 20 may receive a row address from a controller 40. Further, the row decoder 20 may activate the corresponding first conductive line 10 on the basis of the row address received from the controller 40. Similarly, the column decoder 30 may receive a column address from the controller 40. Further, the column decoder 30 may activate the corresponding second conductive line 15 on the basis of the column address received from the controller 40. The memory cell MC may be accessed by activating the first conductive line 10 and the second conductive line 15.

When accessing the memory cell MC, the memory cell MC may be read or sensed through a sense amplifier 25. For example, the sense amplifier 25 may identify the logic state stored in the memory cell MC on the basis of the signal generated by accessing the memory cell MC. The generated signal may include voltage or current. Therefore, the sense amplifier 25 may include a voltage sense amplifier, a current sense amplifier, or both.

For example, a voltage may be applied to the memory cell MC. The magnitude of the current generated by the applied voltage may depend on the resistance of the memory cell MC. Similarly, a current may be applied to the memory cell MC. The magnitude of the voltage for generating the current may depend on the resistance of the memory cell MC. The sense amplifier 25 may include various transistors or amplifiers for detecting and amplifying signals. This may be referred to as latching. Next, the detected logic state of the memory cell MC may be output through an input/output device. In an example, the sense amplifier 25 may be a part of the column decoder 30 or the row decoder 20. Alternatively, the sense amplifier 25 may be connected to or communicate with the column decoder 30 or the row decoder 20.

The memory cell MC may be programmed or written by activating the first conductive line 10 and the second conductive line 15. A logic state may be stored in the memory cell MC. The column decoder 30 or the row decoder 20 may receive data to be written in the memory cell MC, for example, input/output 35. In the case of a phase change memory or a self-selecting memory, the memory cell MC may be written, by heating the information storage pattern, for example, by making a current pass through the information storage pattern. The selenium (Se) ions may be concentrated adjacent to a specific electrode, depending on the logic state written in the memory cell MC, for example, the logic "1" or the logic "0".

For example, the selenium (Se) ions concentrated adjacent to the first electrode according to the polarity of the memory cell MC may generate a first threshold voltage indicating a state of logic "1". The selenium (Se) ions concentrated adjacent to the second electrode may generate a second threshold voltage indicating a state of logic "0". The first threshold voltage and the second threshold voltage may be different in level from each other. The larger the difference between the first threshold voltage and the second threshold voltage is, the more reliable the semiconductor memory device may be.

The controller 40 may control the operations (reading, writing, rewriting, refreshing, discharging, etc.) of the memory cell MC through various components, for example, the row decoder 20, the column decoder 30, and the sense amplifier 25. In some embodiments, one or more of the row decoder 20, the column decoder 30, and the sense amplifier 25 may be placed together with the controller 40. The controller 40 may generate row and column address signals to activate the desired first conductive line 10 and second conductive line 15. The controller 40 may also generate and control various voltages or currents being used during the operation of the memory array. For example, the controller 40 may access one or more memory cells MC and apply the discharged voltage of the memory cells MC to the first conductive line 10 or the second conductive line 15.

The semiconductor memory device according to some embodiments will be described below referring to FIGS. 2 to 12.

Figure 2:
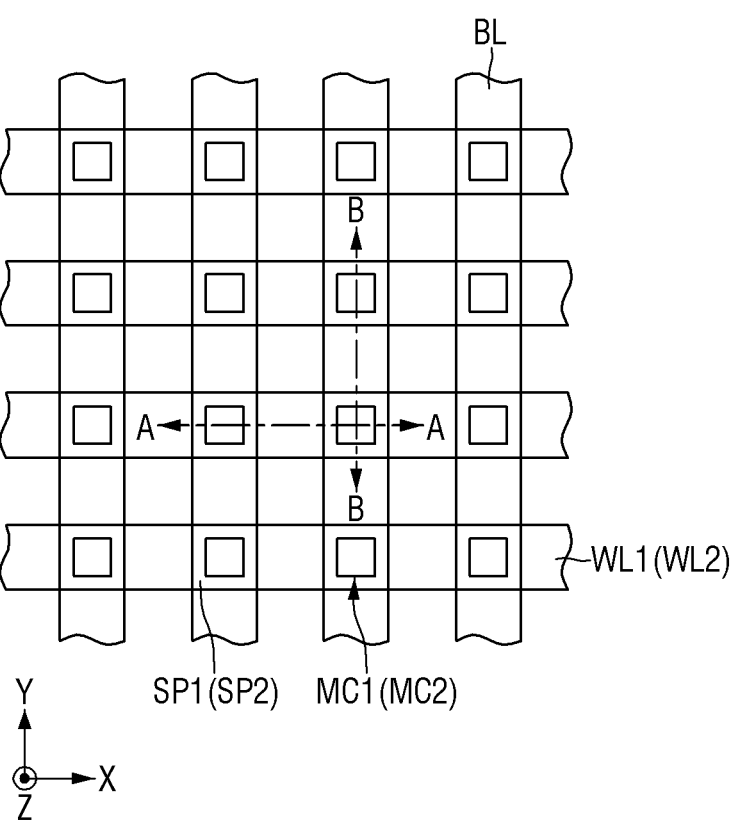
FIG. 2 is an example plan view of a semiconductor memory device according to some embodiments.
Figure 3:
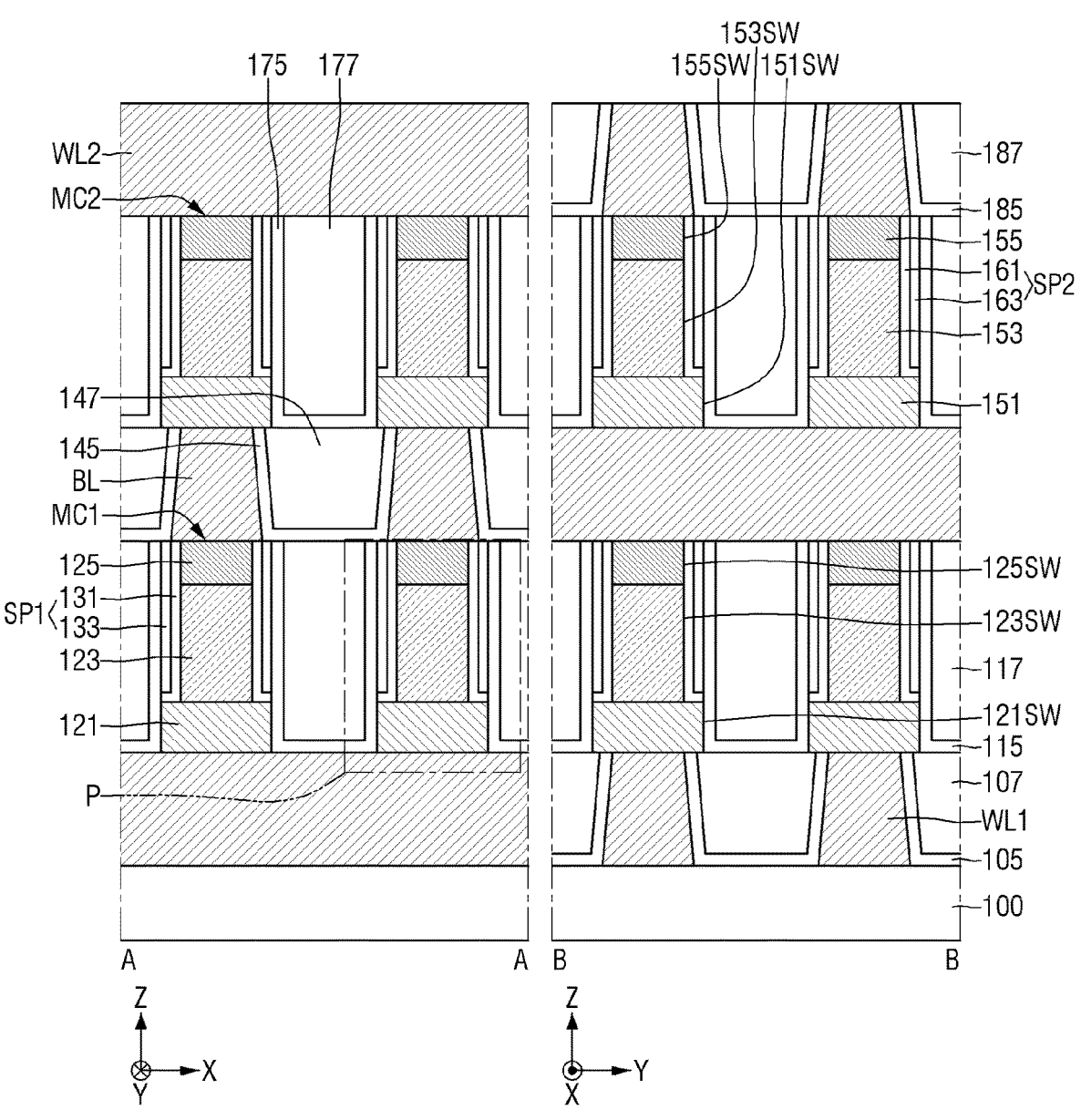
FIG. 3 illustrates cross-sectional views taken along lines A-A and B-B of FIG. 2.
Figure 4:
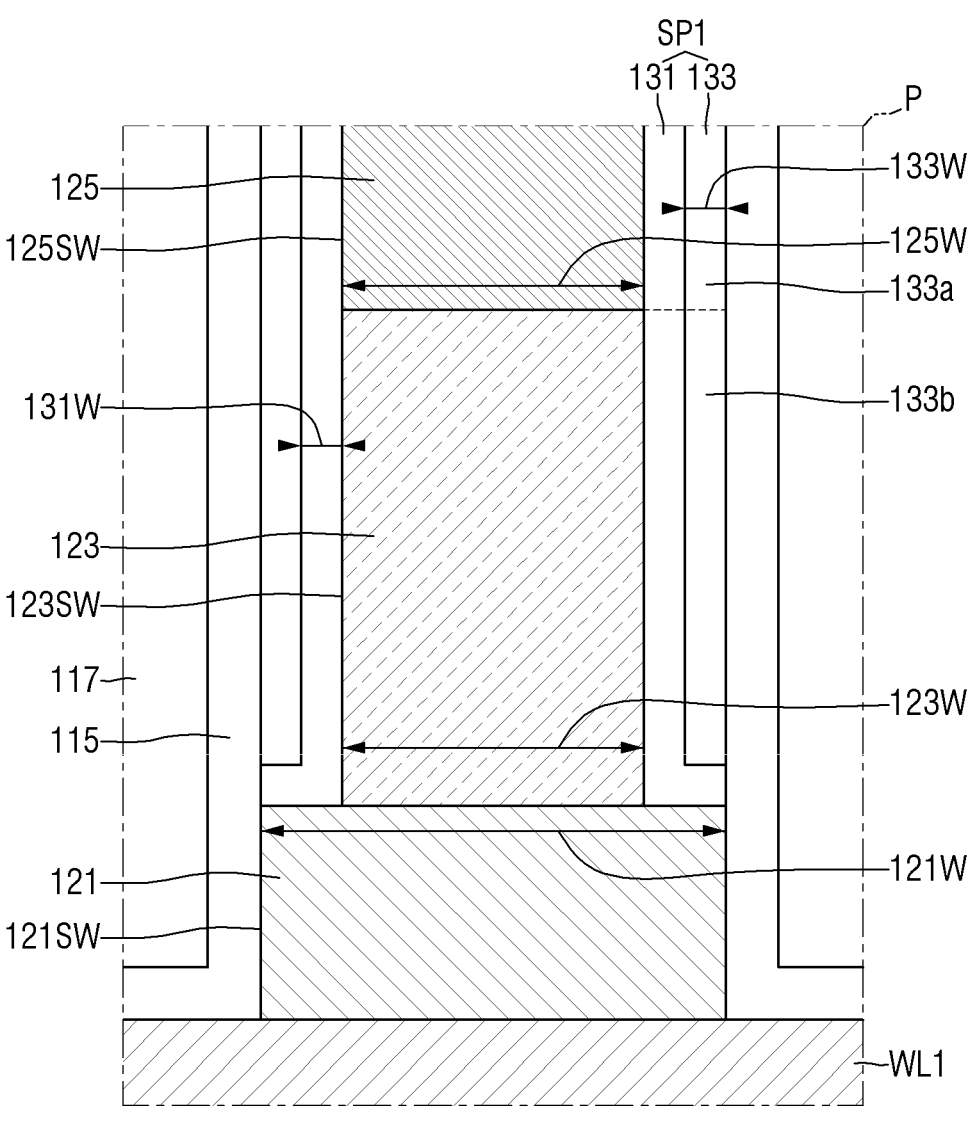
FIG. 4 is an enlarged view of a region P of FIG. 3.

FIG. 2 is an example plan view of the semiconductor memory device according to some embodiments. FIG. 3 illustrates cross-sectional views taken along lines A-A and B-B of FIG. 2. FIG. 4 is an enlarged view of a region P of FIG. 3.

Referring to FIGS. 2 to 4, the semiconductor memory device according to some embodiments may include a substrate 100, a first conductive line WL1, a second conductive line BL, a third conductive line WL2, a first memory cell MC1, a first spacer SP1, a second memory cell MC2, and a second spacer SP2.

The substrate 100 may be a semiconductor substrate. For example, the substrate 100 may be bulk silicon or silicon-on-insulator (SOI). The substrate 100 may be a silicon substrate, or may include other materials, for example, silicon germanium, indium antimonide, lead telluride, indium arsenide, indium phosphide, gallium arsenide, or gallium antimonide. Moreover, the substrate 100 may include an epitaxial layer formed on a base substrate.

The first conductive line WL1, the second conductive line BL, and the third conductive line WL2 may be provided on the substrate 100.

The first conductive line WL1 may extend in a first direction X. At least one or more first conductive lines WL1 may be provided. Each first conductive line WL1 may be spaced apart from each other in a second direction Y. Herein, the first direction X, the second direction Y, and a third direction Z may intersect each other. The first direction X, the second direction Y, and the third direction Z may be substantially perpendicular to each other.

The first conductive line WL1 may be the first conductive line 10 of FIG. 1. That is, the first conductive line WL1 may function as a word line in the semiconductor memory device according to some embodiments.

The second conductive line BL may be provided on the first conductive line WL1. At least one or more second conductive lines BL may be provided. Each second conductive line BL may be spaced apart from the first conductive line WL1 in the third direction Z. Each second conductive line BL may extend in the second direction Y. Each second conductive line BL may be spaced apart from each other in the first direction X.

The second conductive line BL may be the second conductive line 15 of FIG. 1. That is, the second conductive line BL may function as a bit line in the semiconductor memory device according to some embodiments.

The third conductive line WL2 may be provided on the second conductive line BL. At least one or more third conductive lines WL2 may be provided. Each third conductive line WL2 may be spaced apart from the first and second conductive lines WL1 and BL in the third direction Z. Each third conductive line WL2 may extend in the first direction X. Each third conductive line WL2 may be spaced apart from each other in the second direction Y. The third conductive line WL2 may overlap the first conductive line WL1 in the third direction Z, but is not limited thereto.

The third conductive line WL2 may be the first conductive line 10 of FIG. 1. That is, the third conductive line WL2 may function as a word line in the semiconductor memory device according to some embodiments.

In some embodiments, the first and third conductive lines WL1 and WL2 may each extend in the first direction X, and the second conductive line BL may extend in the second direction Y. The second conductive line BL may be interposed between the first and third conductive lines WL1 and WL2.

Each of the first to third conductive lines WL1, BL, and WL2 may include a conductive material. For example, the first to third conductive lines WL1, BL, and WL2 may include, but not limited to, at least one of tungsten (W), tungsten nitride (WN), gold (Au), silver (Ag), copper (Cu), aluminum (Al), titanium aluminum nitride (TiAlN), nickel (Ni), cobalt (Co), chromium (Cr), tin (Sn), zinc (Zn), indium tin oxide (ITO), and combinations thereof.

The first to third conductive lines WL1, BL, and WL2 may include the same material, or may include different materials from each other. In this specification, the first to third conductive lines WL1, BL, and WL2 will be described as each including tungsten (W).

In some embodiments, a first interlayer liner film 105 and a first interlayer filling film 107 may be provided between the first conductive lines WL1. The first interlayer liner film 105 and the first interlayer filling film 107 may fill the space between the respective first conductive lines WL1 spaced apart from each other. The first interlayer liner film 105 may be placed along one or more side walls of the first conductive line WL1 and an upper side of the substrate 100. The first interlayer filling film 107 may be placed on the first interlayer liner film 105. However, embodiments of the present disclosure are not limited thereto, and the first interlayer liner film 105 and the first interlayer filling film 107 may be formed of a single film.

The first interlayer liner film 105 may include, for example, at least one of silicon nitride, silicon oxynitride, and combinations thereof. The first interlayer filling film 107 may include, for example, at least one of silicon oxide, silicon oxynitride, and combinations thereof A second interlayer liner film 145 and a second interlayer filling film 147 may be provided between the second conductive lines BL. The second interlayer liner film 145 and the second interlayer filling film 147 may fill the space between the respective second conductive lines BL spaced apart from each other. The second interlayer liner film 145 may be placed along one or more side walls of the second conductive line BL and an upper surface of a first gap fill film 117, which will be described later. The second interlayer filling film 147 may be placed on the second interlayer liner film 145. However, embodiments of the present disclosure are not limited thereto, and the second interlayer liner film 145 and the second interlayer filling film 147 may be formed of a single film.

The second interlayer liner film 145 may include, for example, at least one of silicon nitride, silicon oxynitride, and combinations thereof. The second interlayer filling film 147 may include, for example, at least one of silicon oxide, silicon oxynitride, and combinations thereof.

A third interlayer liner film 185 and a third interlayer filling film 187 may be provided between the third conductive lines WL2. The third interlayer liner film 185 and the third interlayer filling film 187 may fill a space between the respective third conductive lines WL2 spaced apart from each other. The third interlayer liner film 185 may be placed along the one or more side walls of the third conductive line WL2 and an upper surface of a second gap fill film 177, which will be described later. The third interlayer filling film 187 may be placed on the third interlayer liner film 185. However, embodiments of the present disclosure are not limited thereto, and the third interlayer liner film 185 and the third interlayer filling film 187 may be formed of a single film.

The third interlayer liner film 185 may include, for example, at least one of silicon nitride, silicon oxynitride, and combinations thereof. The third interlayer filling film 187 may include, for example, at least one of silicon oxide, silicon oxynitride, and combinations thereof The first memory cell MCI may be provided between the first conductive line WL1 and the second conductive line BL. The first memory cell MCI may be placed at an intersection between the first conductive line WL1 and the second conductive line BL. One end of the first memory cell MCI may be connected to the word line of the semiconductor memory device. The other end of the first memory cell MC1 may be connected to the bit line of the semiconductor memory device. At least one or more first memory cells MCI may be provided. Each first memory cell MCI may be spaced apart in the first direction X or may be spaced apart in the second direction Y. The first memory cells MCI may extend in the third direction Z.

In some embodiments, the first memory cell MC1 may include a first electrode 121, a first information storage pattern 123, and a second electrode 125.

The first electrode 121, the first information storage pattern 123, and the second electrode 125 may be sequentially aligned in the third direction Z. The first electrode 121 may be placed on the first conductive line WL1. The first information storage pattern 123 may be placed on the first electrode 121. The second electrode 125 may be placed on the first information storage pattern 123. The first information storage pattern 123 may be interposed between the first electrode 121 and the second electrode 125.

The first electrode 121 may be connected to the first conductive line WL1. The first electrode 121 may contact the first conductive line WL1. The first electrode 121 may include a conductive material. As an example, the first electrode 121 may include carbon (C). As another example, the first electrode 121 may include metals such as tungsten (W), platinum (Pt), palladium (Pd), rhodium (Rh), ruthenium (Ru), iridium (Ir), copper (Cu), aluminum (Al), titanium (Ti), and tantalum (Ta), metal nitrides such as titanium nitride (TiN), and combinations thereof.

The second electrode 125 may be provided on the first electrode 121. The second electrode 125 may be connected to the second conductive line BL. The second electrode 125 may contact the second conductive line BL. The second electrode 125 may include a conductive material. As an example, the second electrode 125 may include carbon (C). In another example, the second electrode 125 may include metals such as tungsten (W), platinum (Pt), palladium (Pd), rhodium (Rh), ruthenium (Ru), iridium (Ir), copper (Cu), aluminum (Al), titanium (Ti), and tantalum (Ta), metal nitrides such as titanium nitride (TiN), and combinations thereof.

The first information storage pattern 123 may be provided between the first electrode 121 and the second electrode 125. The first information storage pattern 123 may be connected to the first electrode 121 and the second electrode 125. In some embodiments, the first information storage pattern 123 may function as an information storage element of the first memory cell MC1. The first information storage pattern 123 may include a chalcogenide material. The chalcogenide material may include a compound in which at least one of various chalcogen elements, such as S, Te, or Se is combined with at least one of Ge, Sb, Bi, Al, Tl, Sn, Zn, As, Si, In, Ti, Ga, or P.

As an example, the first information storage pattern 123 may include at least one of GeSe, GeS, AsSe, AsTe, AsS, SiTe, SiSe, SiS, GeAs, SiAs, SnSe, SnTe, GeAsTe, GeAsSe, AlAsTe, AlAsSe, SiAsSe, SiAsTe, GeSeTe, GeSeSb, GaAsSe, GaAsTe, InAsSe, InAsTe, SnAsSe, SnAsTe, GeSi-AsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, GeAsTeZn, GeSiAsSeTe, GeAsSeTeS, GeSiAsSeS, GeSiAsTeS, GeSi-SeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, GeAsSeZnSn, GeSiAsSeTeS, GeSiAsSeTeIn, GeSiAsSeTeGa, GeSiAs-SeTeAl, GeSiAsSeTeTl, GeSiAsSeTeZn, GeSiAsSeTeSn, GeSiAsSeTeP, GeSiAsSeSIn, GeSiAsSeSGa, GeSi-AsSeSAl, GeSiAsSeSTl, GeSiAsSeSZn, GeSiAsSeSSn, GeAsSeTeSIn, GeAsSeTeSGa, GeAsSeTeSAl, GeAs-SeTeSTl, GeAsSeTeSZn, GeAsSeTeSSn, GeAsSeTePIn, GeAsSeTePGa, GeAsSeTePAl, GeAsSeTePTl, GeAs-SeTePZn, GeAsSeTePSn, GeSiAsSeInGa, GeSiAsSeInAl, GeSiAsSeInTl, GeSiAsSeInZn, GeSiAsSeInSn, GeSi-AsSeGaAl, GeSiAsSeGaTl, GeSiAsSeGaZn, GeSiAsSe-GaSn, GeSiAsSeAlSn, GeAsSeTeInGa, GeAsSeTeInAl, GeAsSeTeInTl, GeAsSeTeInZn, GeAsSeTeInSn, GeAs-SeTeGaAl, GeAsSeTeGaTl, GeAsSeTeGaZn, GeAsSeTe-GaSn, GeAsSeTeAlSn, GeAsSeSInGa, GeAsSeSInAl, GeAsSeSInTl, GeAsSeSInZn, GeAsSeSInSn, GeAsS-eSGaAl, GeAsSeSGaTl, GeAsSeSGaZn, GeAsSeSGaSn, and GeAsSeSAlSn.

The semiconductor memory device according to some embodiments may store data through the displacement of ions included in the first information storage pattern 123. The logic state of data stored in the first information storage pattern 123 may be based on the polarity of the program voltage. For example, when a voltage is applied to the first electrode 121 and the second electrode 125, ions included in the first information storage pattern 123 may move toward the first electrode 121 or the second electrode 125. As an example, the first information storage pattern 123 may include selenium (Se) ions. When a voltage is applied to the first electrode 121 and the second electrode 125, the selenium (Se) ions in the first information storage pattern 123 may move toward the first electrode 121 or the second electrode 125.

For example, the selenium (Se) ions concentrated adjacent to the first electrode 121 according to the polarity of the first memory cell MC1 may generate a first threshold voltage indicating a state of logic "1". The selenium (Se) ions concentrated adjacent to the second electrode 125 according to the polarity of the first memory cell MC1 may generate a second threshold voltage indicating a state of logic "0". The first threshold voltage and the second threshold voltage may be different in level from each other. The larger the difference between the first threshold voltage and the second threshold voltage is, the more reliable the semiconductor memory device may be.

In some embodiments, the first spacer SP1 may be placed along a part of one or more side walls of the first memory cell MC1.

The first spacer SP1 may cover a part of one or more side walls of the first memory cell MC1. For example, in FIG. 4, the first spacer SP1 may be placed on a part of an upper surface of the first electrode 121. The first spacer SP1 may be placed on one or more side walls 123 SW of the first information storage pattern 123 and one or more side walls 125 SW of the second electrode 125. The first spacer SP1 may cover one or more side walls 123 SW of the first information storage pattern 123 and one or more side walls 125SW of the second electrode 125. The first spacer SP1 may not cover the side walls 121SW of the first electrode 121. The first spacer SP1 may not overlap the first electrode 121 in the first direction X or the second direction Y. The first spacer SP1 may overlap the first electrode 121 in the third direction Z. The first spacer SP1 may not overlap the first information storage pattern 123 and the second electrode 125 in the third direction Z. The first spacer SP1 may overlap the first information storage pattern 123 and the second electrode 125 in the first direction X or the second direction Y.

In some embodiments, the first spacer SP1 may include a first sub-spacer 131 and a second sub-spacer 133.

The first sub-spacers 131 may be placed on one or more side walls 123SW of the first information storage pattern 123 and one or more side walls 125SW of the second electrode 125. A second sub-spacer 133 may be placed on the first sub-spacer 131. The first sub-spacer 131 may be placed along a part of the upper surface of the first electrode 121, one or more side walls 123 SW of the first information storage pattern 123, and one or more side walls 125SW of the second electrode 125. The first sub-spacer 131 may contact a part of the upper surface of the first electrode 121. The first sub-spacer 131 may contact one or more side walls 123 SW of the first information storage pattern 123 and one or more side walls 125SW of the second electrode 125. The second sub-spacer 133 may not be in contact with the first electrode 121, the first information storage pattern 123, and the second electrode 125.

The first sub-spacer 131 and the second sub-spacer 133 may be formed of different materials from each other. For example, the first sub-spacer 131 may include a nitride-based insulating material. The second sub-spacer 133 may include an oxide-based insulating material. In an example, the first sub-spacer 131 may include silicon nitride (SiN), and the second sub-spacer 133 may include silicon oxide ($SiO_2$) but are not limited thereto.

Since the semiconductor memory device according to some embodiments may include the first spacer SP1, damage applied to the first information storage pattern 123 may be reduced when forming the first information storage pattern 123. In addition, since the second sub-spacer 133 may include an oxide-based insulating material, heat applied to the first information storage pattern 123 may be blocked. Therefore, the mobility of ions in the first information storage pattern 123 may be improved. As a result, a semiconductor memory device having improved reliability can be realized.

In some embodiments, the width 131 W of the first sub-spacer 131 in a first horizontal direction may be constant with increased distance from the substrate 100. The width 133W of the second sub-spacer 133 in the first horizontal direction may be constant with increased distance from the substrate 100.

For example, the second sub-spacer 133 may include a first portion 133a that overlaps the second electrode 125 in the first direction X or the second direction Y, and a second portion 133b that overlaps the first information storage pattern 123 in the first direction X or the second direction Y. A width of the first portion 133a of the second sub-spacer 133 in the first horizontal direction and a width of the second portion 133b of the second sub-spacer 133 in the first horizontal direction may be the same, but are not limited thereto.

In some embodiments, a width 121W of the first electrode 121 in the first horizontal direction may be greater than a width 123W of the first information storage pattern 123 in the first horizontal direction. Specifically, the width 121W of the first electrode 121 may be greater than the width 123W of the first information storage pattern 123 at the portion on which the first electrode 121 and the first information storage pattern 123 are in contact with each other. Moreover, the surface area of the upper surface of the first electrode 121 may be greater than the surface area of the bottom surface of the first information storage pattern 123 at the portion on which the first electrode 121 and the first information storage pattern 123 are in contact with each other.

In some embodiments, the width 123W of the first information storage pattern 123 in the first horizontal direction may be equal to the width 125W of the second electrode 125 in the first horizontal direction. Specifically, the width 123W of the first information storage pattern 123 may be the same as the width 125W of the second electrode 125 at the portion on which the first information storage pattern 123 and the second electrode 125 are in contact with each other. Also, the surface area of the upper surface of the first information storage pattern 123 may be the same size as the surface area of the bottom surface of the second electrode 125 at the portion on which the first information storage pattern 123 and the second electrode 125 are in contact with each other. However, embodiments of the present disclosure are not limited thereto.

Referring to FIG. 3 again, a first capping liner film 115 and the first gap fill film 117 may be placed between the first memory cells MC1. The first capping liner film 115 and the first gap fill film 117 may fill the space between the first memory cells MC1.

The first capping liner film 115 may be placed along one or more side walls 121SW of the first electrode 121, one or more side walls of the first spacer SP1, an upper surface of the first conductive line WL1, and an upper surface of the first interlayer filling film 107. The first gap fill film 117 may be placed on the first capping liner film 115.

The first capping liner film 115 may include, for example, silicon nitride. The first gap fill film 117 may include, for example, at least one of silicon oxide, silicon oxycarbide, and a low thermal conductivity material having a lower thermal conductivity than silicon oxide. As an example, the first gap fill film 117 may include, but not limited to, at least one of $SiO_2$, SiOC, SOG (Spin-On Glass), SOD (Spin-On Dielectric), HDP (High Density Plasma) oxide, FOX (Flowable Oxide), TOSZ (Torene SilaZene), USG (Undoped Silica Glass), BSG (BoroSilica Glass), PSG (PhosphoSilica Glass), BPSG (BoroPhosphoSilica Glass), TEOS (Tetra Ethyl Ortho Silicate), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (Bis-benzoCycloButenes), SiLK, polyimide, porous polymeric material, and combinations thereof.

In some embodiments, the second memory cell MC2 may be provided between the second conductive line BL and the third conductive line WL2.

The second memory cell MC2 may be placed at the intersection between the second conductive line BL and the third conductive line WL2. One end of the second memory cell MC2 may be connected to the word line of the semiconductor memory device. The other end of the second memory cell MC2 may be connected to the bit line of the semiconductor memory device. At least one or more second memory cells MC2 may be provided. Each second memory cell MC2 may be spaced apart in the first direction X or may be spaced apart in the second direction Y. The second memory cells MC2 may extend in the third direction Z. The second memory cells MC2 may overlap the first memory cells MC1 in the third direction Z.

In some embodiments, the second memory cell MC2 may include a third electrode 151, a second information storage pattern 153, and a fourth electrode 155.

The third electrode 151, the second information storage pattern 153, and the fourth electrode 155 may be sequentially aligned in the third direction Z. The third electrode 151 may be placed on the second conductive line BL. The second information storage pattern 153 may be placed on the third electrode 151. The fourth electrode 155 may be placed on the second information storage pattern 153. The second information storage pattern 153 may be interposed between the third electrode 151 and the fourth electrode 155.

The third electrode 151 may be connected with the second conductive line BL. The third electrode 151 may contact the second conductive line BL. The third electrode 151 may include a conductive material. As an example, the third electrode 151 may include carbon (C). In another example, the third electrode 151 may include metals such as tungsten (W), platinum (Pt), palladium (Pd), rhodium (Rh), ruthenium (Ru), iridium (Ir), copper (Cu), aluminum (Al), titanium (Ti), and tantalum (Ta), metal nitrides such as titanium nitride (TiN), and combinations thereof.

A fourth electrode 155 may be provided on the third electrode 151. The fourth electrode 155 may be connected with the third conductive line WL2. The fourth electrode 155 may contact the third conductive line WL2. The fourth electrode 155 may include a conductive material. As an example, the fourth electrode 155 may include carbon (C). In another example, the fourth electrode 155 may include metals such as tungsten (W), platinum (Pt), palladium (Pd), rhodium (Rh), ruthenium (Ru), iridium (Ir), copper (Cu), aluminum (Al), titanium (Ti), and tantalum (Ta), metal nitrides such as titanium nitride (TiN), and combinations thereof.

The second information storage pattern 153 may be provided between the third electrode 151 and the fourth electrode 155. The second information storage pattern 153 may be connected with the third electrode 151 and the fourth electrode 155. In some embodiments, the second information storage pattern 153 may function as an information storage element of the second memory cell MC2. The second information storage pattern 153 may include a chalcogenide material. The chalcogenide material may include a compound in which at least one of various chalcogen elements, such as S, Te, or Se is combined with at least one of Ge, Sb, Bi, Al, Tl, Sn, Zn, As, Si, In, Ti, Ga, or P.

As an example, the second information storage pattern 153 may include at least one of GeSe, GeS, AsSe, AsTe, AsS, SiTe, SiSe, SiS, GeAs, SiAs, SnSe, SnTe, GeAsTe, GeAsSe, AlAsTe, AlAsSe, SiAsSe, SiAsTe, GeSeTe, GeSeSb, GaAsSe, GaAsTe, InAsSe, InAsTe, SnAsSe, SnAsTe, GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, GeAsTeZn, GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeZnSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, GeAsSeZnSn, GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, and GeAsSeSAlSn.

The semiconductor memory device according to some embodiments may store data through the displacement of ions included in the second information storage pattern 153. The logic state of data stored in the second information storage pattern 153 may be based on the polarity of the program voltage. For example, when a voltage is applied to the third electrode 151 and the fourth electrode 155, ions included in the second information storage pattern 153 may move toward the third electrode 151 or the fourth electrode 155. As an example, the second information storage pattern 153 may include selenium (Se) ions. When a voltage is applied to the third electrode 151 and the fourth electrode 155, the selenium (Se) ions in the second information storage pattern 153 may move toward the third electrode 151 or the fourth electrode 155.

For example, the selenium (Se) ions concentrated adjacent to the third electrode 151 according to the polarity of the second memory cell MC2 may generate a first threshold voltage indicating a state of logic "1". The selenium (Se) ions concentrated adjacent to the fourth electrode 155 according to the polarity of the second memory cell MC2 may generate a second threshold voltage indicating a state of logic "0". The first threshold voltage and the second threshold voltage may be different in level from each other. The larger the difference between the first threshold voltage and the second threshold voltage is, the more reliable the semiconductor memory device may be.

In some embodiments, the second spacer SP2 may be placed along a part of one or more side walls of the second memory cell MC2.

The second spacer SP2 may cover a part of one or more side walls of the second memory cell MC2. For example, the second spacer SP2 may be placed on a part of an upper surface of the third electrode 151. The second spacer SP2 may be placed on one or more side walls 153 SW of the second information storage pattern 153 and one or more side walls 155SW of the fourth electrode 155. The second spacer SP2 may cover one or more side walls 153 SW of the second information storage pattern 153 and one or more side walls 155SW of the fourth electrode 155. The second spacer SP2 may not cover the side walls 151SW of the third electrode 151. The second spacer SP2 may not overlap the third electrode 151 in the first direction X or the second direction Y. The second spacer SP2 may overlap the third electrode 151 in the third direction Z. The second spacer SP2 may not overlap the second information storage pattern 153 and the fourth electrode 155 in the third direction Z. The second spacer SP2 may overlap the second information storage pattern 153 and the fourth electrode 155 in the first direction X or the second direction Y.

The second spacer SP2 may include a third sub-spacer 161 and a fourth sub-spacer 163.

The third sub-spacer 161 may be placed on one or more side walls 153 SW of the second information storage pattern 153 and one or more side walls 155SW of the fourth electrode 155. The fourth sub-spacer 163 may be placed on the third sub-spacer 161. The third sub-spacer 161 may be placed along a part of the upper surface of the third electrode 151, one or more side walls 153SW of the second information storage pattern 153, and one or more side walls 155SW of the fourth electrode 155. The third sub-spacer 161 may contact a part of the upper surface of the third electrode 151. The third sub-spacer 161 may contact one or more side walls 153SW of the second information storage pattern 153 and one or more side walls 155SW of the fourth electrode 155. The fourth sub-spacer 163 may not be in contact with the third electrode 151, the second information storage pattern 153, and the fourth electrode 155.

The third sub-spacer 161 and the fourth sub-spacer 163 may be formed of different materials from each other. For example, the third sub-spacer 161 may include a nitride-based insulating material. The fourth sub-spacer 163 may include an oxide-based insulating material. In an example, the third sub-spacer 161 may include silicon nitride (SiN), and the fourth sub-spacer 163 may include silicon oxide ($SiO_2$) but are not limited thereto.

Since the semiconductor memory device according to some embodiments may include the second spacer SP2, damage applied to the second information storage pattern 153 may be reduced when forming the second information storage pattern 153. In addition, since the fourth sub-spacer 163 may include an oxide-based insulating material, heat applied to the second information storage pattern 153 may be blocked. Therefore, the mobility of ions in the second information storage pattern 153 may be improved. As a result, a semiconductor memory device with improved reliability can be realized.

Since the detailed structure of the second spacer SP2 may be the same as the detailed structure of the first spacer SP1, the detailed structure of the second spacer SP2 will not be described.

In some embodiments, a width of the third electrode 151 in the first horizontal direction may be greater than a width of second information storage pattern 153 in the first horizontal direction. Specifically, the width of the third electrode 151 may be greater than the width of the second information storage pattern 153 at the portion on which the third electrode 151 and the second information storage pattern 153 are in contact with each other. Moreover, the surface area of the upper surface of the third electrode 151 may be greater than the surface area of a bottom surface of the second information storage pattern 153 at the portion on which the third electrode 151 and the second information storage pattern 153 are in contact with each other.

In some embodiments, the width of second information storage pattern 153 in the first horizontal direction may be the same as the width of the fourth electrode 155 in the first horizontal direction. Specifically, the width of the second information storage pattern 153 may be the same as the width of the fourth electrode 155 at the portion on which the second information storage pattern 153 and the fourth electrode 155 are in contact with each other. Further, the surface area of an upper surface of the second information storage pattern 153 may be the same size as the surface area of a bottom surface of the fourth electrode 155 at the portion on which the second information storage pattern 153 and the fourth electrode 155 are in contact with each other. However, embodiments of the present disclosure are not limited thereto.

A second capping liner film 175 and the second gap fill film 177 may be placed between the second memory cells MC2. The second capping liner film 175 and the second gap fill film 177 may fill the space between the second memory cells MC2.

The second capping liner film 175 may be placed along one or more side walls 151SW of the third electrode 151, one or more side walls of the second spacers SP2, an upper surface of the second conductive line BL, and an upper surface of the second interlayer filling film 147. The second gap fill film 177 may be placed on the second capping liner film 175.

The second capping liner film 175 may include, for example, silicon nitride. For example, the second gap fill film 177 may include at least one of silicon oxide, silicon oxycarbide, and a low thermal conductivity material having a lower thermal conductivity than silicon oxide. As an example, the second gap fill film 177 may include, but not limited to, at least one of $SiO_2$, SiOC, SOG (Spin-On Glass), SOD (Spin-On Dielectric), HDP (High Density Plasma) oxide, FOX (Flowable Oxide), TOSZ (Torene SilaZene), USG (Undoped Silica Glass), BSG (BoroSilica Glass), PSG (PhosphoSilica Glass), BPSG (BoroPhosphoSilica Glass), TEOS (Tetra Ethyl Ortho Silicate), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (Bis-benzoCycloButenes), SiLK, polyimide, porous polymeric material, and combinations thereof.

Figure 5:
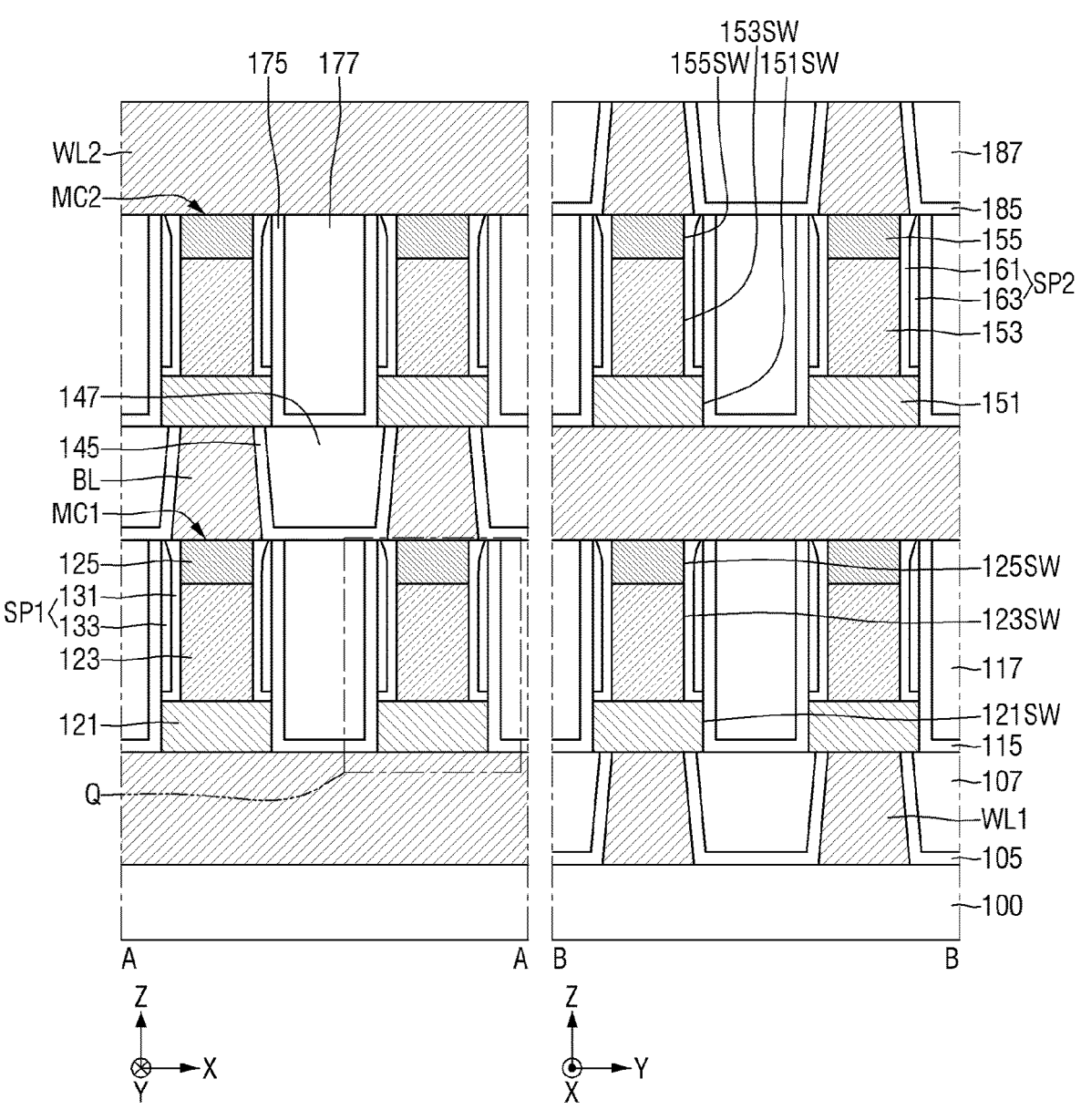
FIG. 5 illustrates example diagrams of a semiconductor memory device according to some embodiments.
Figure 6:
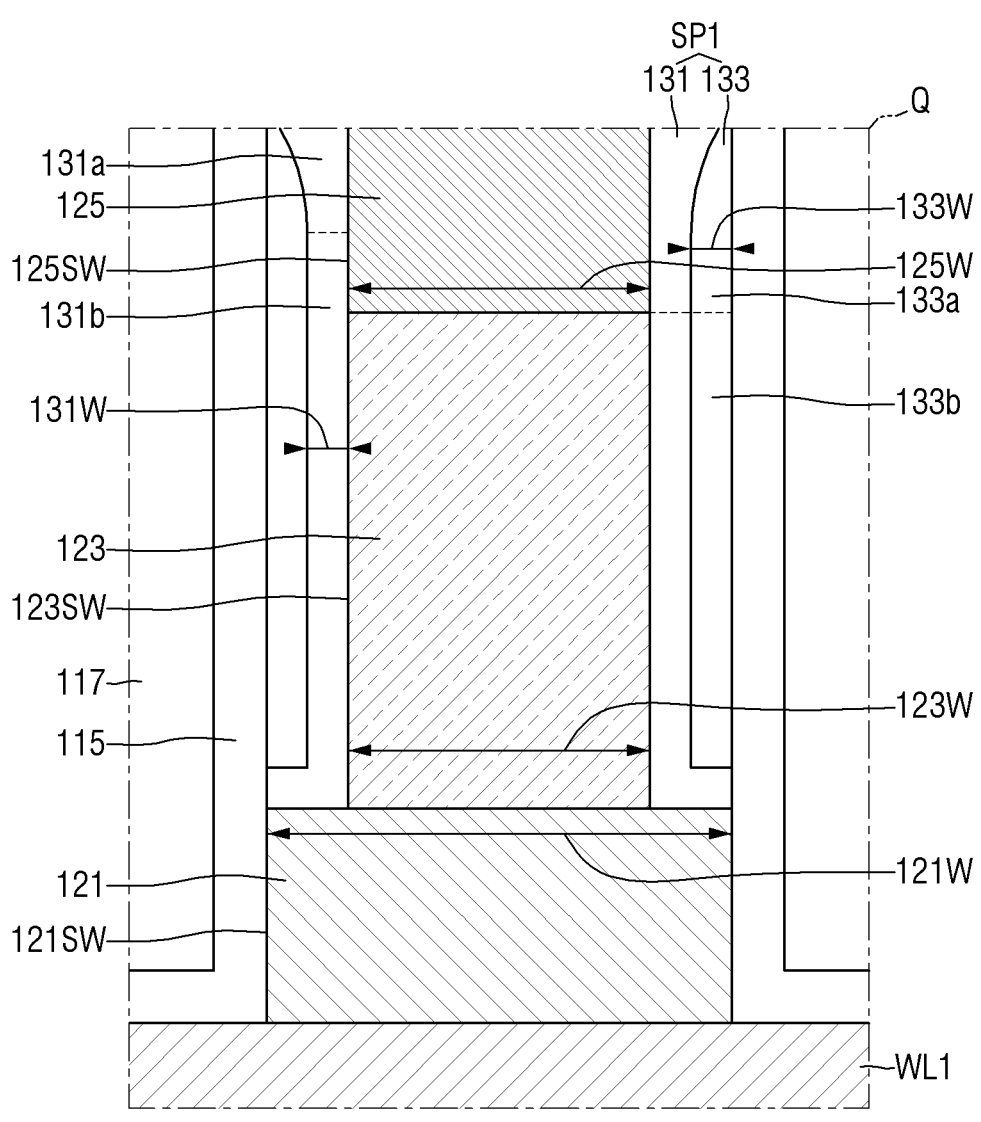
FIG. 6 is an enlarged view of a region Q of FIG. 5.

FIG. 5 illustrates example diagrams of a semiconductor memory device according to some embodiments. FIG. 6 is an enlarged view of a region Q of FIG. 5. For reference, FIG. 5 illustrates example cross-sectional views taken along lines A-A and B-B of FIG. 2. For the convenience of explanation, the explanation will focus on points that are different from those explained using FIGS. 3 to 4. Since the third sub-spacer 161 may be substantially the same as the first sub-spacer 131 and the fourth sub-spacer 163 may be substantially the same as the second sub-spacer 133, detailed description of the third sub-spacer 161 and the fourth sub-spacer 163 will not be provided.

Referring to FIGS. 5 and 6, the width 131W of the first sub-spacer 131 in the first horizontal direction may not be constant with increased distance from the substrate 100. The width of the third sub-spacer 161 in the first horizontal direction may not be constant with increased distance from the substrate 100.

For example, in FIG. 6, the first sub-spacer 131 may include a first portion 131a whose width in the first horizontal direction increases with increased distance from the substrate 100, and a second portion 131b whose width in the first horizontal direction is constant with increased distance from the substrate 100 at least until the second portion 131b meets the first portion 131a in the third direction Z. The first portion 131a of the first sub-spacer 131 may be placed on the second portion 131b of the first sub-spacer 131, but is not limited thereto.

In the process of forming the first sub-spacer 131, a pre-first sub-spacer (131p of FIG. 15B) may not be conformally formed. The width of the pre-first sub-spacer (131p of FIG. 15B) in the first horizontal direction may increase with increased distance from the substrate 100. Further, a width of a pre-first sub-spacer (131*p* of FIG. 15B) formed on the upper surface of the second electrode 125 may be greater than a width of the pre-first sub-spacer (131*p* of FIG. 15B) formed on one or more side walls 125SW of the second electrode 125 and one or more side walls 123 SW of the first information storage pattern 123. Accordingly, the first sub-spacer 131 may include the first portion 131*a* whose width in the first horizontal direction increases with increased distance from the substrate 100.

In some embodiments, the width of the first portion 133*a* of the second sub-spacer 133 in the first horizontal direction may include a portion that decreases with increased distance from the substrate 100. The width of the first portion 133*a* of the second sub-spacer 133 in the first horizontal direction may be smaller than the width of the second portion 133*b* of the second sub-spacer 133 in the first horizontal direction. However, the embodiment is not limited thereto.

Although the length of the first portion 13 la of the first sub-spacer 131 in the third direction Z is shown to be shorter than the length of the first portion 133*a* of the second sub-spacer 133 in the third direction Z in FIG. 6, the present disclosure is not limited thereto.

Figure 7:
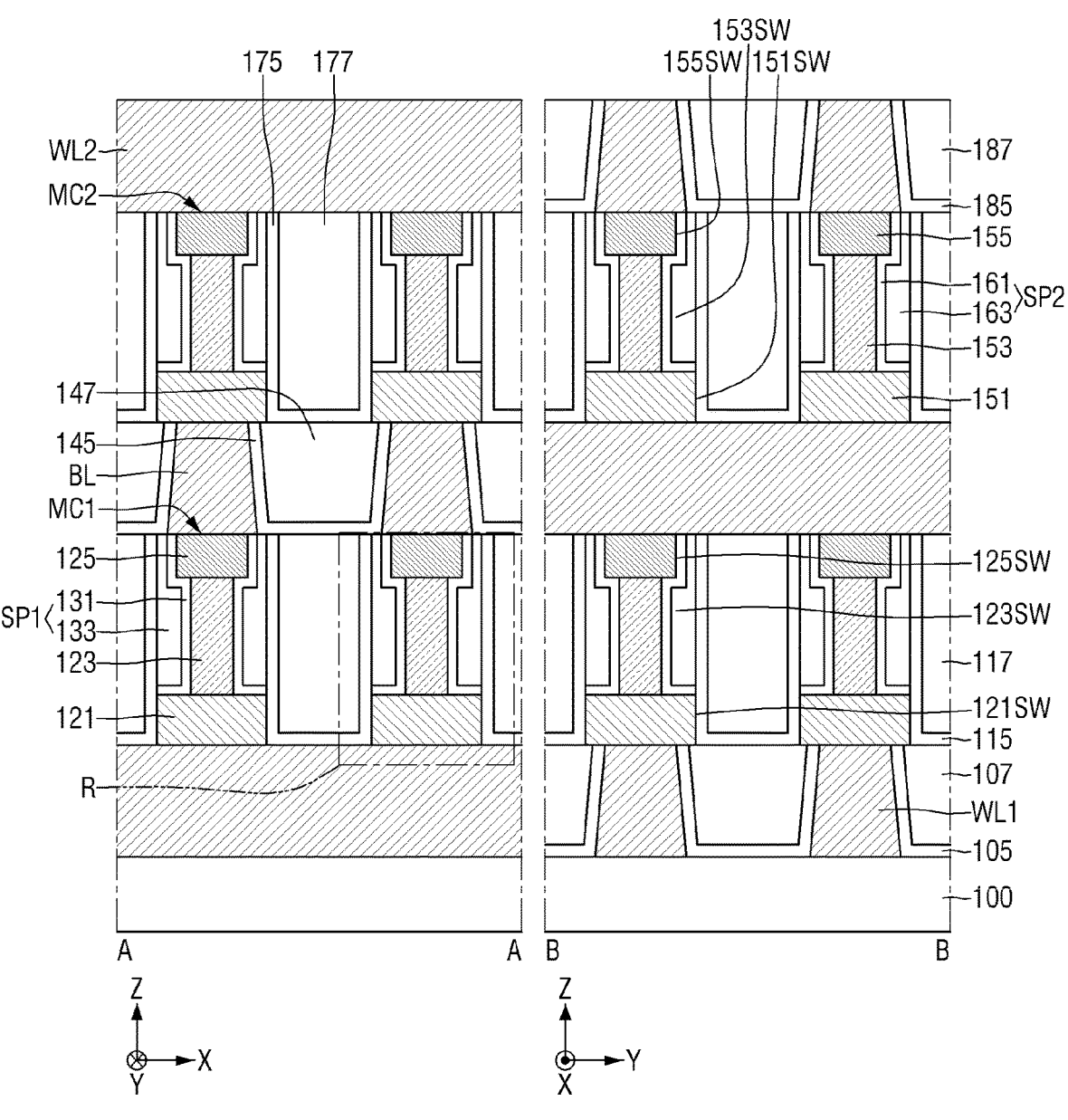
FIG. 7 illustrates example diagrams of a semiconductor memory device according to some embodiments.
Figure 8:
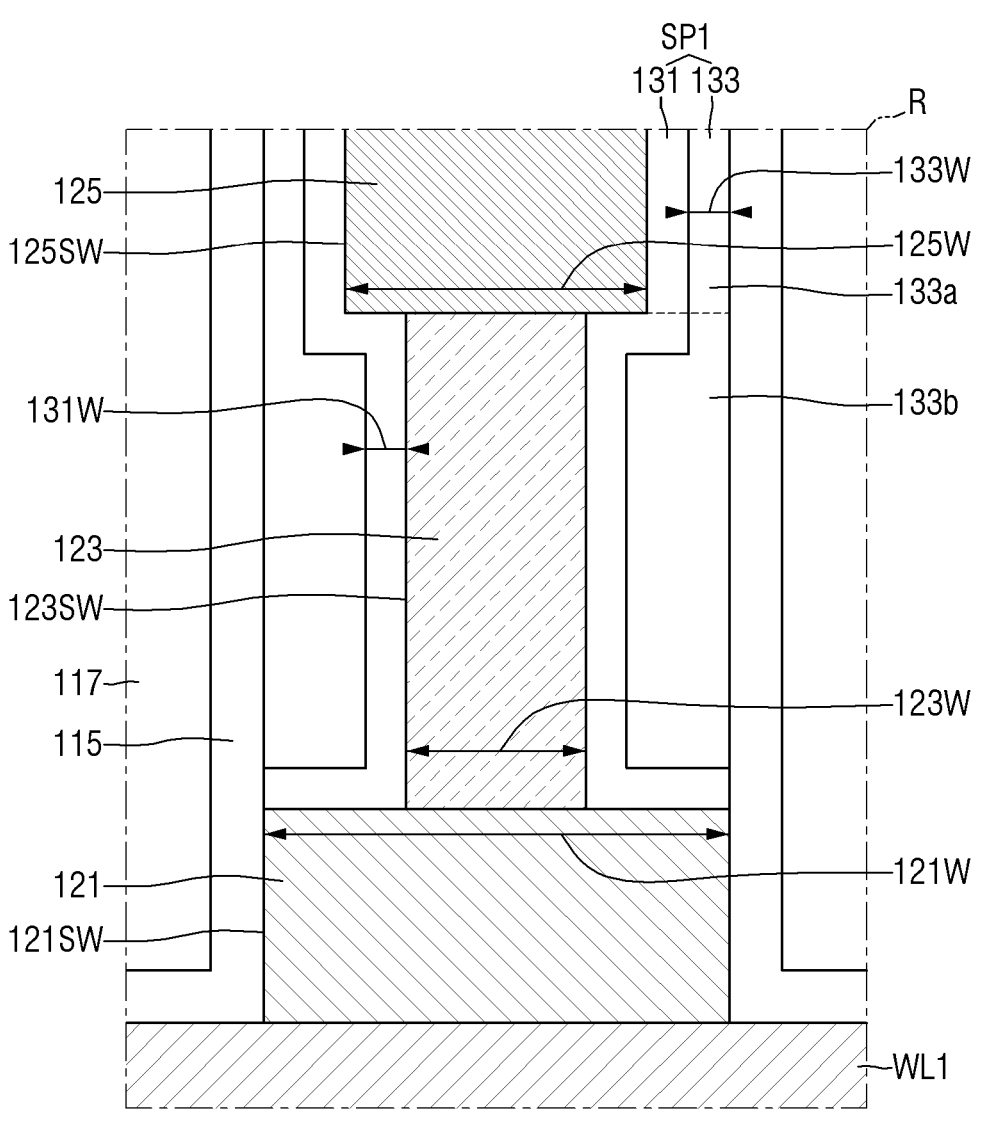
FIG. 8 is an enlarged view of a region R of FIG. 7.

FIG. 7 illustrates example diagrams of the semiconductor memory device according to some embodiments. FIG. 8 is an enlarged view of a region R of FIG. 7. For reference, FIG. 7 illustrates example cross-sectional views taken along lines A-A and B-B of FIG. 2. For the convenience of explanation, the explanation will focus on points that are different from those explained using FIGS. 3 to 6. Since the third sub-spacer 161 may be substantially the same as the first sub-spacer 131 and the fourth sub-spacer 163 may be substantially the same as the second sub-spacer 133, detailed description of the third sub-spacer 161 and the fourth sub-spacer 163 will not be provided.

Referring to FIGS. 7 and 8, the width of the first information storage pattern 123 in the first horizontal direction may be smaller than the width of the second electrode 125 in the first horizontal direction. The width of the second information storage pattern 153 in the first horizontal direction may be smaller than the width of the fourth electrode 155 in the first horizontal direction.

For example, in FIG. 8, the width 123W of the first information storage pattern 123 in the first horizontal direction may be smaller than the width 125W of the second electrode 125 in the first horizontal direction at the portion on which the first information storage pattern 123 and the second electrode 125 are in contact with each other. The surface area of the upper surface of the first information storage pattern 123 is smaller than the surface area of the bottom surface of the second electrode 125 at the portion on which the first information storage pattern 123 and the second electrode 125 are in contact with each other.

In the process of forming the first information storage pattern 123, due to the etching selectivity between the second electrode 125 and the first information storage pattern 123, the etching rate of the first information storage pattern 123 may be greater than the etching rate of the second electrode 125. Therefore, the width 123W of the first information storage pattern 123 may be smaller than the width 125W of the second electrode 125.

In some embodiments, the width 131W of the first sub-spacer 131 in the first horizontal direction may be constant. The width of the second sub-spacer 133 in the first horizontal direction may not be constant. For example, the width of the first portion 133*a* of the second sub-spacer 133 in the first horizontal direction may be smaller than the width of the second portion 133*b* of the second sub-spacer 133 in the first horizontal direction. As the width 123W of the first information storage pattern 123 in the first horizontal direction decreases, the width of the second portion 133*b* of the second sub-spacer 133 in the first horizontal direction may increase.

Figure 9:
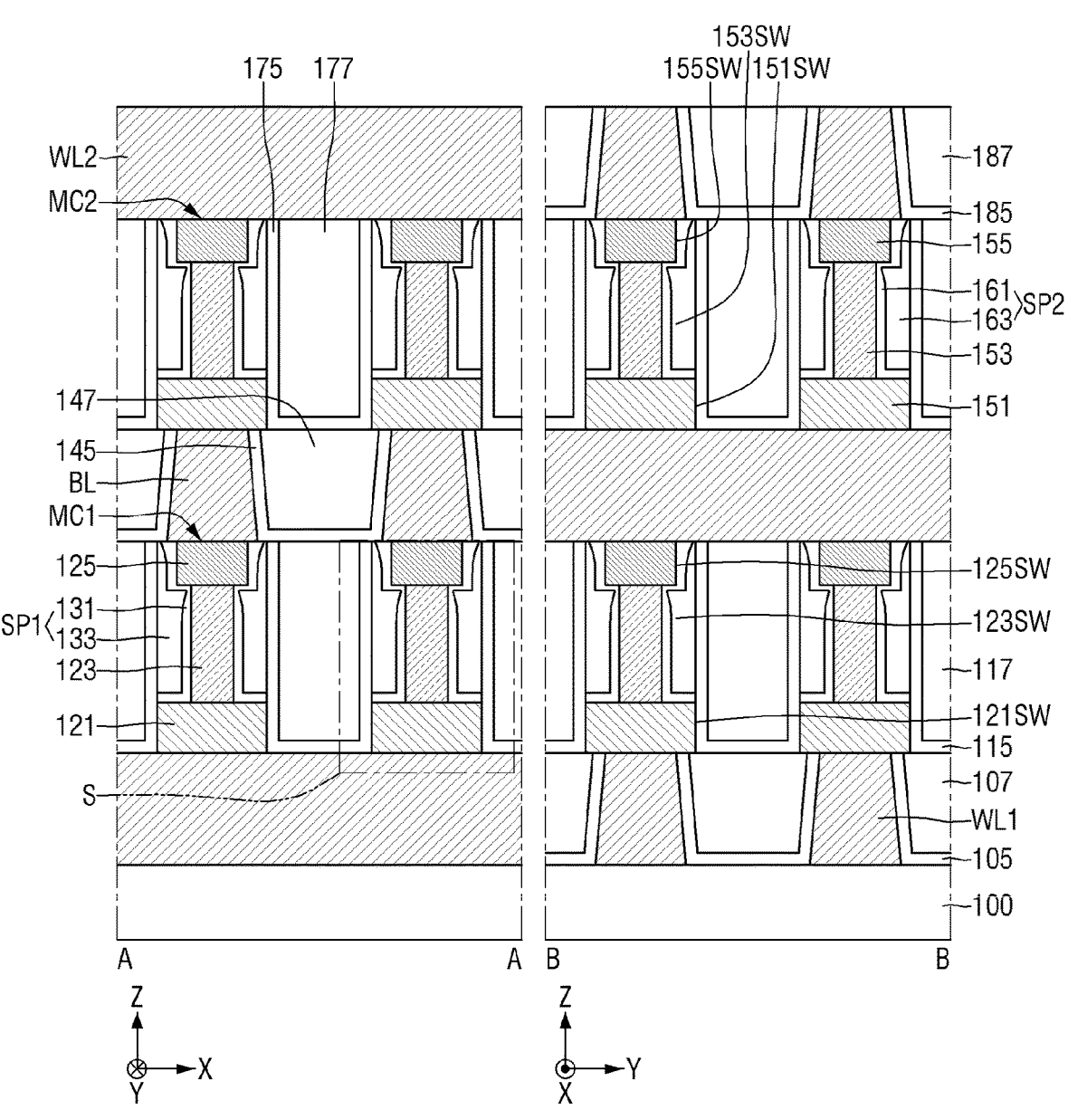
FIG. 9 illustrates example diagrams of a semiconductor memory device according to some embodiments.
Figure 10:
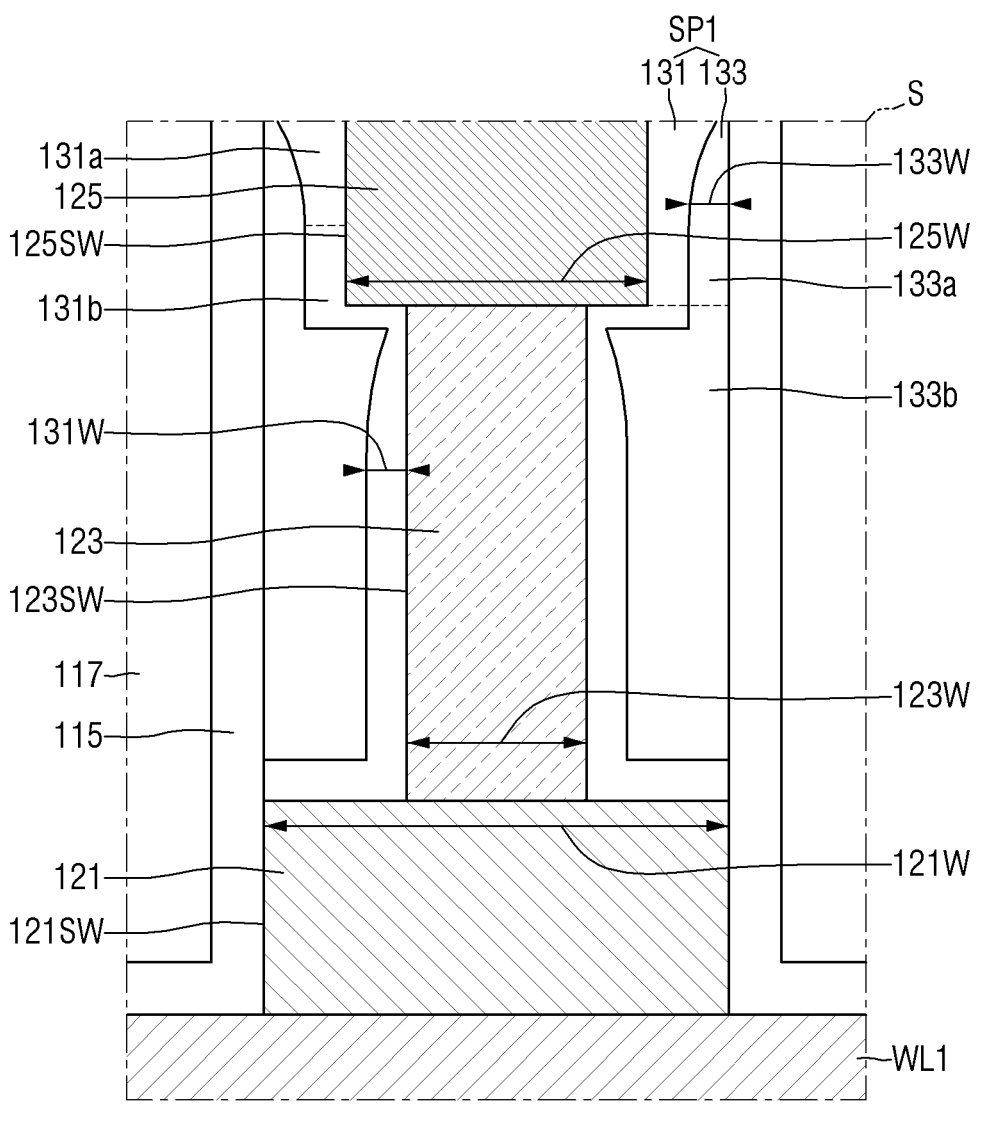
FIG. 10 is an enlarged view of a region S of FIG. 9.

FIG. 9 illustrates example diagrams of a semiconductor memory device according to some embodiments. FIG. 10 is an enlarged view of a region S of FIG. 9. For reference, FIG. 9 illustrates example cross-sectional views taken along lines A-A and B-B of FIG. 2. For the convenience of explanation, the explanation will focus on points that are different from those explained using FIGS. 3 to 8. Since the third sub-spacer 161 may be substantially the same as the first sub-spacer 131 and the fourth sub-spacer 163 may be substantially the same as the second sub-spacer 133, detailed description of the third sub-spacer 161 and the fourth sub-spacer 163 will not be provided.

Referring to FIGS. 9 and 10, the width of the first information storage pattern 123 in the first horizontal direction may be smaller than the width of the second electrode 125 in the first horizontal direction. The width 131W of the first sub-spacer 131 in the first horizontal direction may not be constant with increased distance from the substrate 100.

For example, in FIG. 10, the width of the first sub-spacers 131 on one or more side walls 123SW of the first information storage pattern 123 in the first horizontal direction may include a portion that decreases with increased distance from the substrate 100. The width of the first sub-spacer 131 on the side wall 125SW of the second electrode 125 in the first horizontal direction may include a portion that increases with increased distance from the substrate 100.

A portion of the first sub-spacer 131 that overlaps the first information storage pattern 123 in the first direction X or the second direction Y may include a portion whose width decreases with increased distance from the substrate 100. A portion of the first sub-spacer 131 that overlaps the second electrode 125 in the first direction X or the second direction Y may include a portion whose width increases with increased distance from the substrate 100.

When the pre-first sub-spacer (131*p* of FIG. 15B) is formed, the pre-first sub-spacer (131*p* of FIG. 15B) may not be conformally formed. Therefore, the width 131W of the first sub-spacer 131 in the first horizontal direction may not be constant with increased distance from the substrate 100.

In some embodiments, the width 123W of the first information storage pattern 123 in the first horizontal direction may be smaller than the width 125W of the second electrode 125 in the first horizontal direction, at the portion on which the first information storage pattern 123 and the second electrode 125 are in contact with each other. The surface area of the upper surface of the first information storage pattern 123 may be smaller than the surface area of the bottom surface of the second electrode 125, at the portion on which the first information storage pattern 123 and the second electrode 125 are in contact with each other.

In some embodiments, the width of the first sub-spacer 131 in the first horizontal direction at the boundary between the second electrode 125 and the first information storage pattern 123 may be the smallest. However, embodiments of the present disclosure are not limited thereto.

Figure 11:
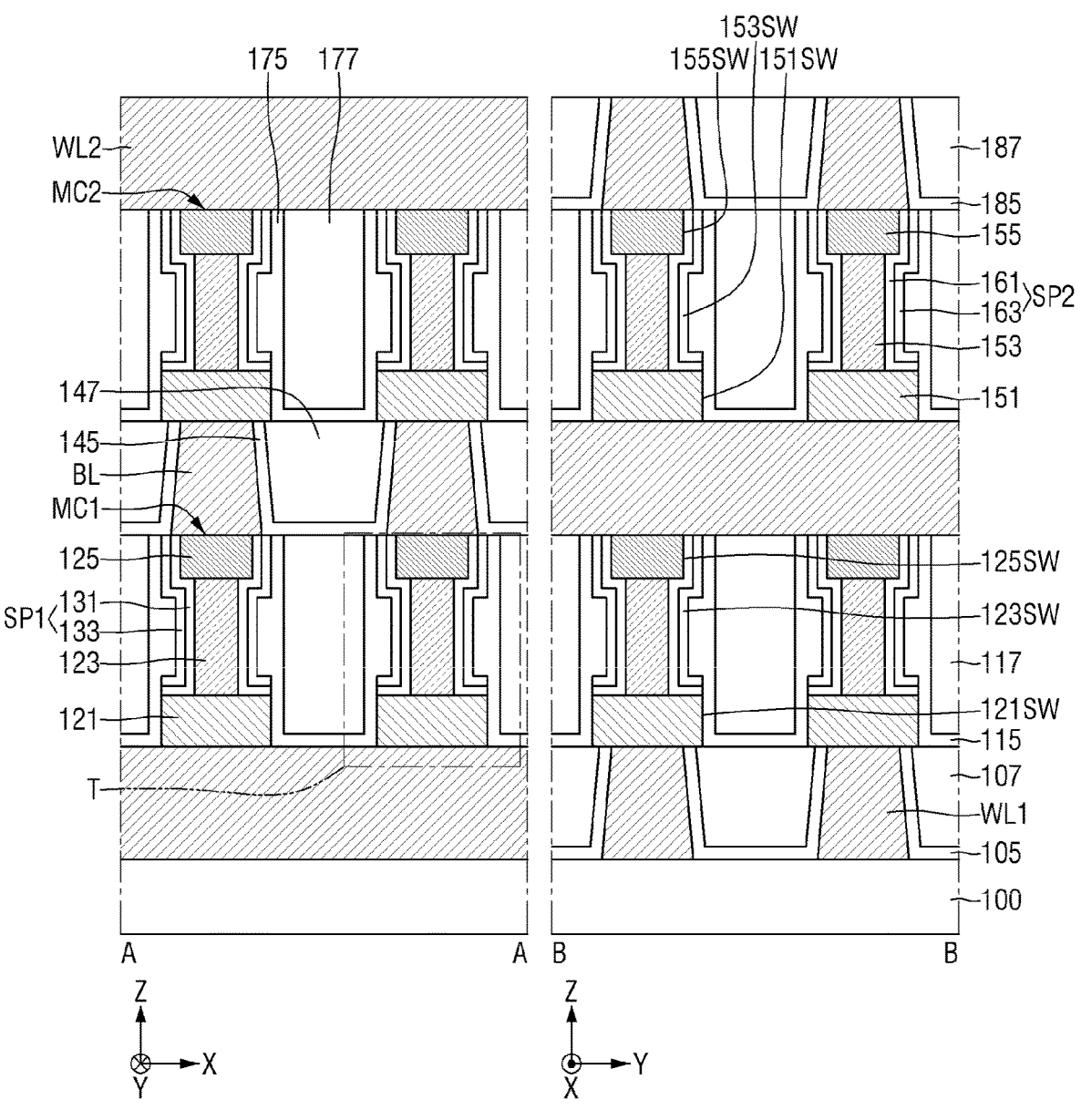
FIG. 11 illustrates example diagrams of a semiconductor memory device according to some embodiments.
Figure 12:
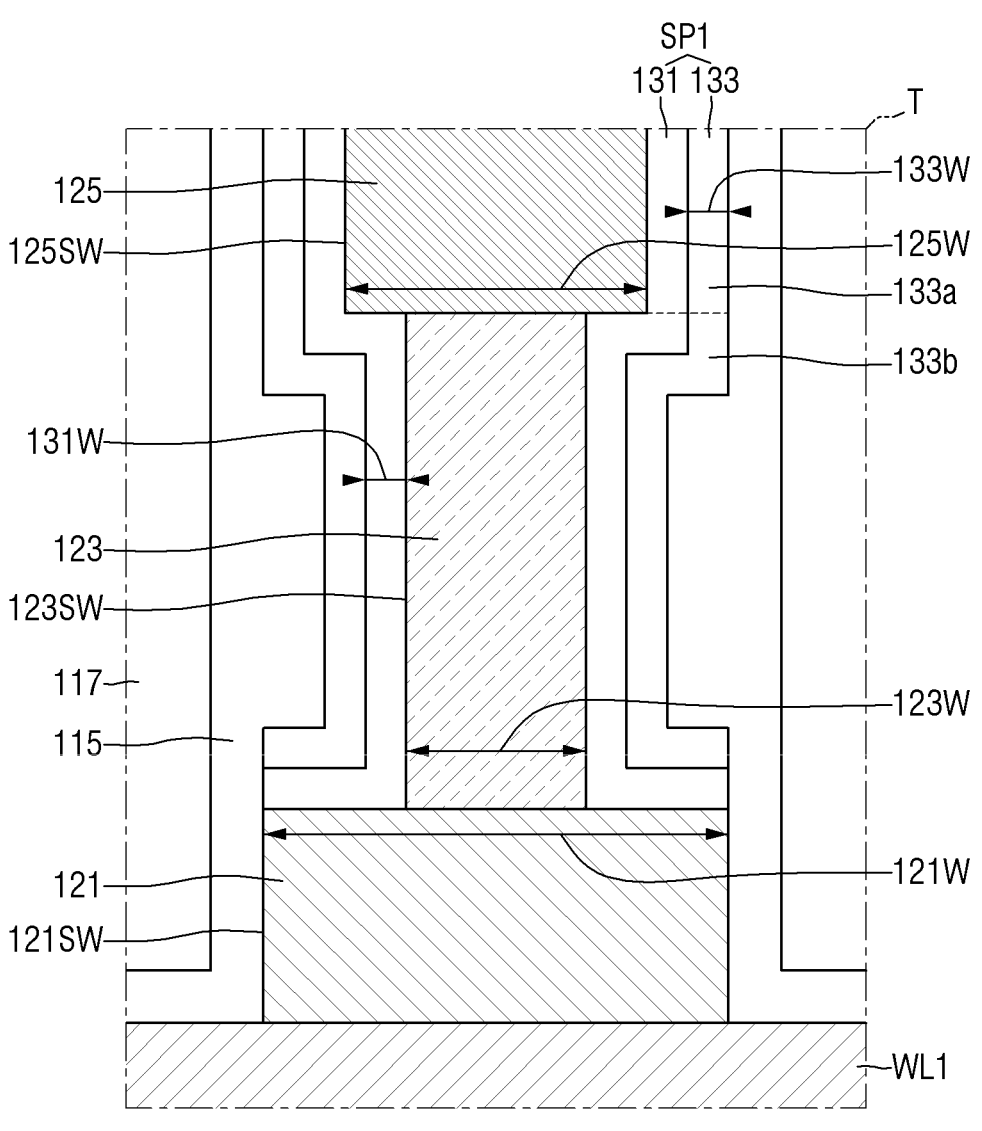
FIG. 12 is an enlarged view of a region T of FIG. 11.

FIG. 11 illustrates example diagrams of a semiconductor memory device according to some embodiments. FIG. 12 is an enlarged view of a region T of FIG. 11. For reference, FIG. 11 illustrates example cross-sectional views taken along lines A-A and B-B of FIG. 2. For the convenience of explanation, the explanation will focus on points that are different from those explained using FIGS. 3 to 10. Since the third sub-spacer 161 may be substantially the same as the first sub-spacer 131 and the fourth sub-spacer 163 may be substantially the same as the second sub-spacer 133, detailed description of the third sub-spacer 161 and the fourth sub-spacer 163 will not be provided.

Referring to FIGS. 11 and 12, the width of the first information storage pattern 123 in the first horizontal direction may be smaller than the width of the second electrode 125 in the first horizontal direction. The width 133W of the second sub-spacer 133 in the first horizontal direction may be constant.

For example, in FIG. 12, the width 123W of the first information storage pattern 123 in the first horizontal direction may be smaller than the width 125W of the second electrode 125 in the first horizontal direction, at the portion on which the first information storage pattern 123 and the second electrode 125 are in contact with each other. The surface area of the upper surface of the first information storage pattern 123 may be smaller than the surface area of the bottom surface of the second electrode 125, at the portion on which the first information storage pattern 123 and the second electrode 125 are in contact with each other.

The width 131W of the first sub-spacer 131 in the first horizontal direction may be constant. The width 133W of the second sub-spacer 133 may be constant. The width of the first capping liner film 115 in the first horizontal direction may not be constant. One side wall of the first capping liner film 115 may be placed along an outer side wall of the second sub-spacer 133. The other side wall of the first capping liner film 115 may extend in the third direction Z.

A method for fabricating the semiconductor memory device according to some embodiments will be described below referring to FIGS. 13 to 20. FIGS. 13 to 20 are diagrams for illustrating the processes for fabricating the semiconductor memory device having the cross-sections of FIG. 3.

Figure 13:
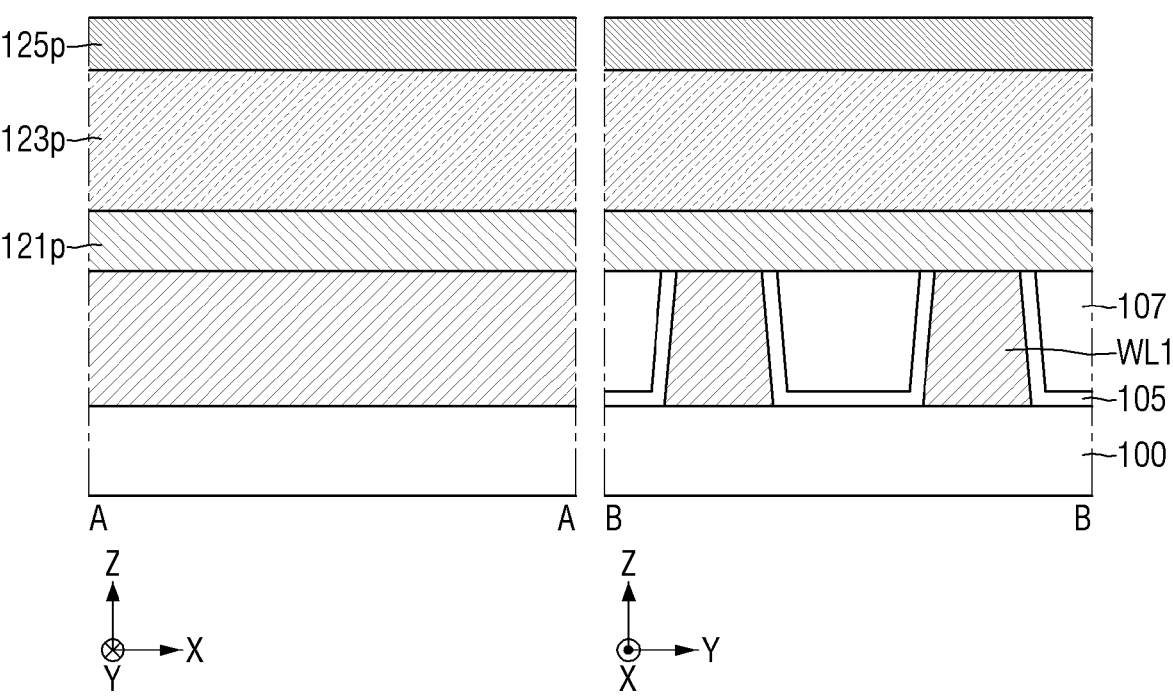
FIGS. 13 to 20 are diagrams illustrating the processes for fabricating the semiconductor memory device of FIG. 3.

First, referring to FIG. 13, the substrate 100 may be provided. The first conductive line WL1 may be formed on the substrate 100. The first conductive line WL1 may extend in the first direction X. Each first conductive line WL1 may be spaced apart from each other in the second direction Y. The first interlayer liner film 105 and the first interlayer filling film 107 may be formed between each first conductive line WL1.

A pre-first electrode 121p, a pre-first information storage pattern 123p, and a pre-second electrode 125p may be sequentially formed on the first conductive line WL1 and the first interlayer filling film 107.

The pre-first electrode 121p and the pre-second electrode 125p may include a conductive material. As an example, the pre-first electrode 121p and the pre-second electrode 125p may include, but not limited to, carbon (C).

The pre-first information storage pattern 123p may include a chalcogenide material. The chalcogenide material may include a compound in which at least one of various chalcogen elements, such as S, Te, or Se is combined with at least one of Ge, Sb, Bi, Al, Tl, Sn, Zn, As, Si, In, Ti, Ga, or P.

As an example, the pre-first information storage pattern 123p may include at least one of GeSe, GeS, AsSe, AsTe, AsS, SiTe, SiSe, SiS, GeAs, SiAs, SnSe, SnTe, GeAsTe, GeAsSe, AlAsTe, AlAsSe, SiAsSe, SiAsTe, GeSeTe, GeSeSb, GaAsSe, GaAsTe, InAsSe, InAsTe, SnAsSe, SnAsTe, GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, GeAsTeZn, GeSiAsSeTe, GeAsSeTeS, GeSiAsSeS, GeSi-AsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAs-TeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, GeAsSeZnSn, GeSiAsSeTeS, GeSiAsSeTeIn, GeSiAsSeTeGa, GeSiAs-SeTeAl, GeSiAsSeTeTl, GeSiAsSeTeZn, GeSiAsSeTeSn, GeSiAsSeTeP, GeSiAsSeSIn, GeSiAsSeSGa, GeSi-AsSeSAl, GeSiAsSeSTl, GeSiAsSeSZn, GeSiAsSeSSn, GeAsSeTeSIn, GeAsSeTeSGa, GeAsSeTeSAl, GeAs-SeTeSTl, GeAsSeTeSZn, GeAsSeTeSSn, GeAsSeTePIn, GeAsSeTePGa, GeAsSeTePAl, GeAsSeTePTl, GeAs-SeTePZn, GeAsSeTePSn, GeSiAsSeInGa, GeSiAsSeInAl, GeSiAsSeInTl, GeSiAsSeInZn, GeSiAsSeInSn, GeSi-AsSeGaAl, GeSiAsSeGaTl, GeSiAsSeGaZn, GeSiAsSe-GaSn, GeSiAsSeAlSn, GeAsSeTeInGa, GeAsSeTeInAl, GeAsSeTeInTl, GeAsSeTeInZn, GeAsSeTeInSn, GeAs-SeTeGaAl, GeAsSeTeGaTl, GeAsSeTeGaZn, GeAsSeTe-GaSn, GeAsSeTeAlSn, GeAsSeSInGa, GeAsSeSInAl, GeAsSeSInTl, GeAsSeSInZn, GeAsSeSInSn, GeAsS-eSGaAl, GeAsSeSGaTl, GeAsSeSGaZn, GeAsSeSGaSn, and GeAsSeSAlSn.

Figure 14:
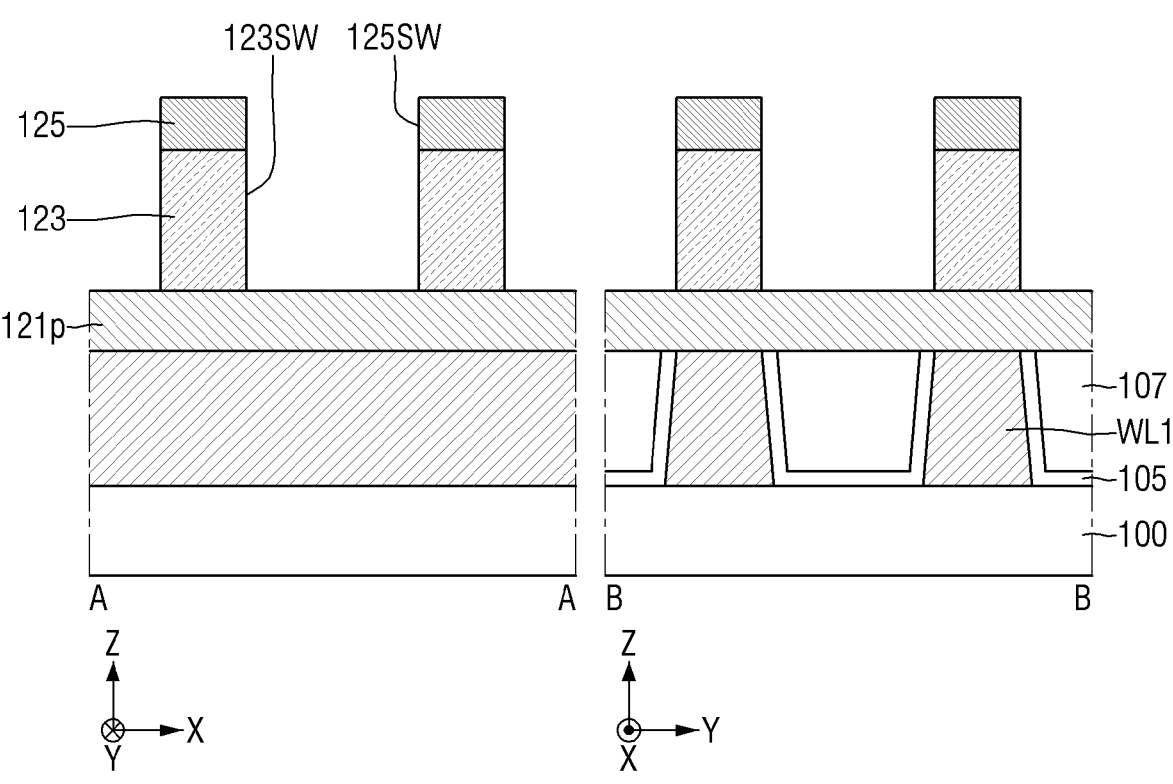

Referring to FIG. 14, the pre-second electrode 125p and the pre-first information storage pattern 123p may be patterned to form the second electrode 125 and the first information storage pattern 123, respectively.

When the pre-second electrode 125p and the pre-first information storage pattern 123p are patterned, the pre-first electrode 121p may not be patterned. First, the pre-second electrode 125p may be etched using a first etchant. The first etchant may not etch the pre-first information storage pattern 123p. Subsequently, the pre-first information storage pattern 123p may be etched using a second etchant. Etching of the pre-second electrode 125p and etching of the pre-first information storage pattern 123p may be performed in situ. The second etchant may not etch the pre-first electrode 121p.

Figure 15A:
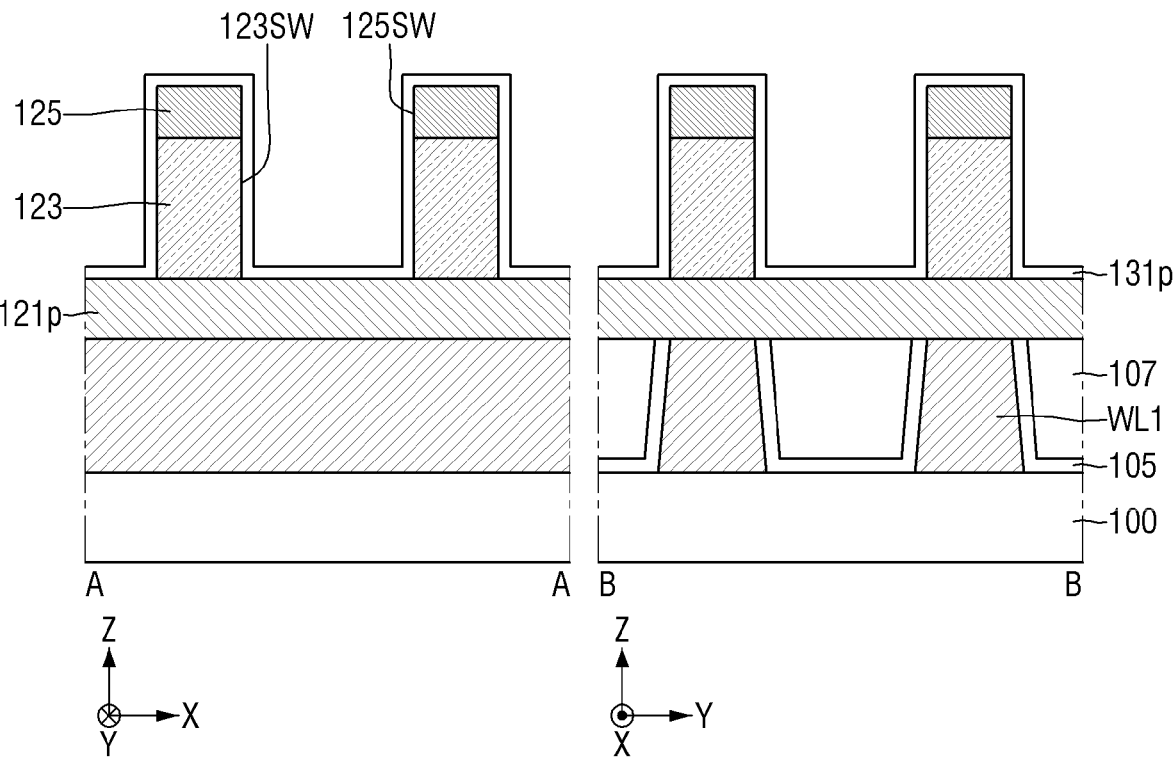
Figure 15B:
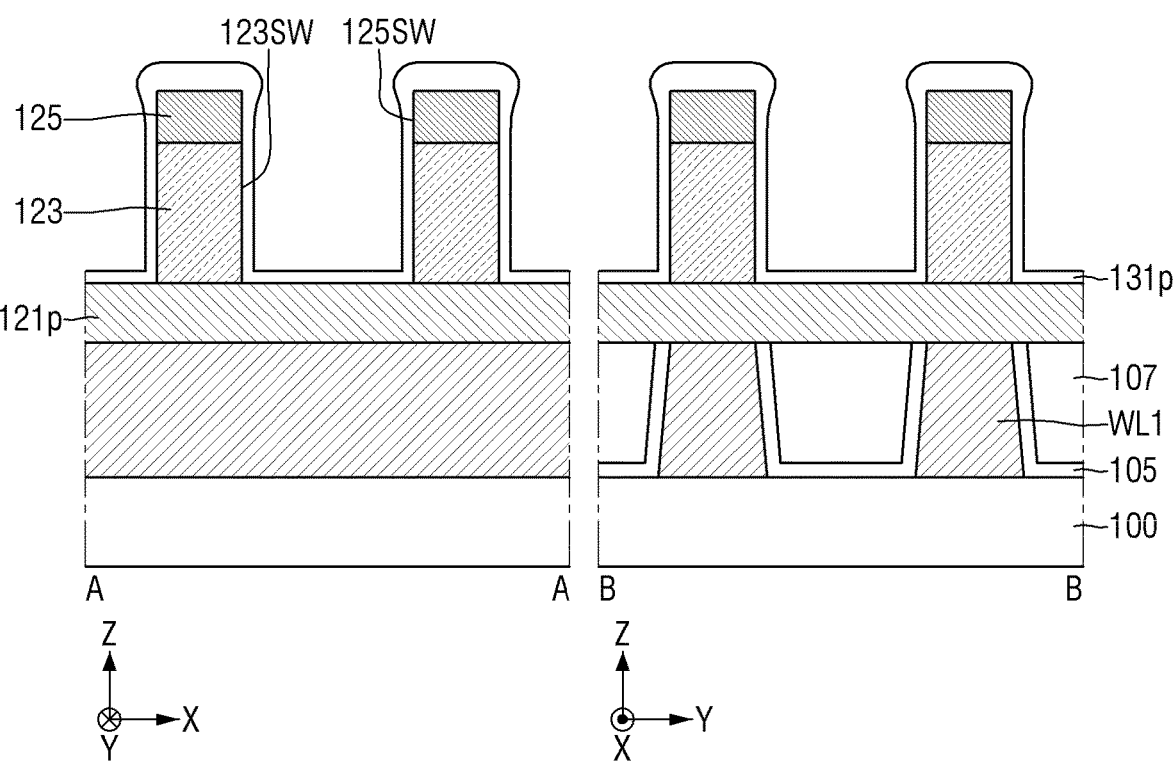

Referring to FIGS. 15A and 15B, the pre-first sub-spacer 131p may be formed along an upper surface of the pre-first electrode 121p, one or more side walls 123SW of the first information storage pattern 123, one or more side walls 125SW of the second electrode 125, and the upper surface of the second electrode 125.

In FIG. 15A, the pre-first sub-spacer 131p may be conformally formed. The width of the pre-first sub-spacer 131p in the first horizontal direction may be constant.

In FIG. 15B, the pre-first sub-spacer 131p may not be conformally formed. The width of the pre-first sub-spacer 131p in the first horizontal direction may not be constant. For example, the pre-first sub-spacer 131p on one or more side walls 123 SW of the first information storage pattern 123 and one or more side walls 125SW of the second electrode 125 may include a portion whose width in the first horizontal direction increases with increased distance from the substrate 100. The width of the pre-first sub-spacer 131p on the upper surface of the second electrode 125 may be greater than the width of the pre-first sub-spacer 131p on the upper surface of the pre-first electrode 121p.

The pre-first sub-spacer 131p may include a nitride-based insulating material. For example, the pre-first sub-spacer 131p may include, but not limited to, silicon nitride (SiN).

Figure 16:
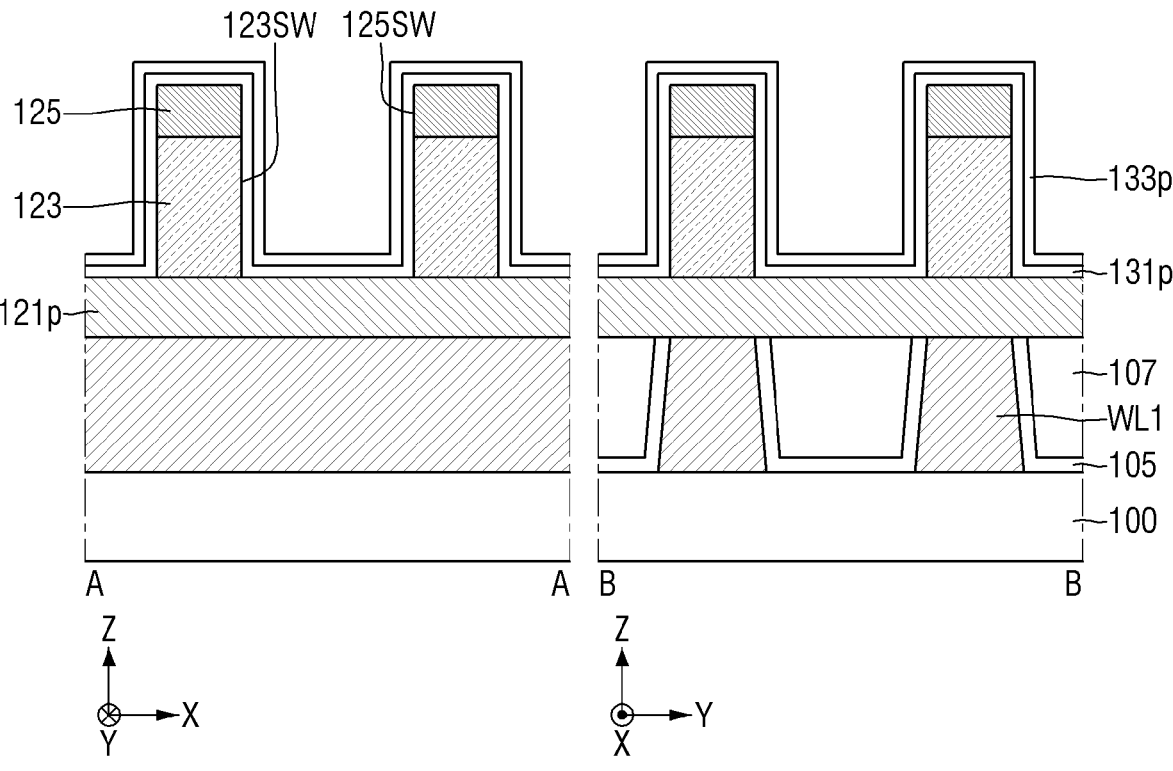

Referring to FIG. 16, a pre-second sub-spacer 133p may be formed on the pre-first sub-spacer 131p.

The pre-second sub-spacer 133p may be formed conformally on the pre-first sub-spacer 131p. The width of the pre-second sub-spacers 133p in the first horizontal direction may be constant.

The pre-second sub-spacer 133p may include an oxide-based insulating material. For example, the pre-second sub-spacer 133p may include, but not limited to, silicon oxide (SiO₂).

Figure 17:
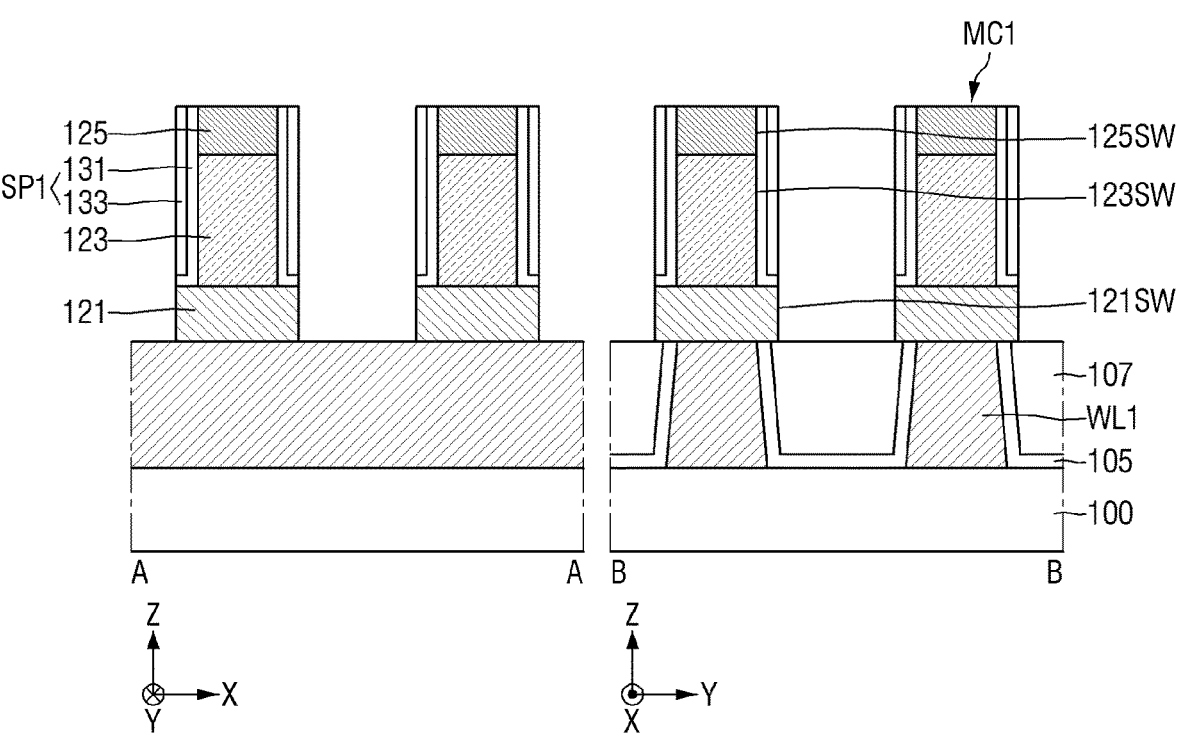

Referring to FIG. 17, the pre-second sub-spacer 133p, the pre-first sub-spacer 131p, and the pre-first electrode 121p may be patterned to form the second sub-spacer 133, the first sub-spacer 131, and the first electrode 121.

An upper surface of the second electrode 125 may be exposed by patterning the pre-second sub-spacer 133p and the pre-first sub-spacer 131p. The second sub-spacer 133 and the first sub-spacer 131 may constitute the first spacer SP1. The first electrode 121, the first information storage pattern 123, and the second electrode 125 may constitute the first memory cell MC1.

In some embodiments, the first spacer SP1 may be formed on the first electrode 121. The first spacer SP1 may be formed on a part of one or more side walls of the first memory cell MC1. The first spacer SP1 may be formed on one or more side walls 123SW of the first information storage pattern 123 and one or more side walls 125SW of the second electrode 125.

In some embodiments, the width of the first electrode 121 in the first horizontal direction may be greater than the width of the first information storage pattern 123 in the first horizontal direction at the portion on which the first electrode 121 and the first information storage pattern 123 are in contact with each other. The surface area of the upper surface of the first electrode 121 may be greater than the surface area of the bottom surface of the first information storage pattern 123 at the portion on which the first electrode 121 and the first information storage pattern 123 are in contact with each other. The first electrode 121 and the first spacer SP1 may be formed in the same etching process. Accordingly, the width of the first electrode 121 in the first horizontal direction may be greater than the width of the first information storage pattern 123 in the first horizontal direction.

Figure 18:
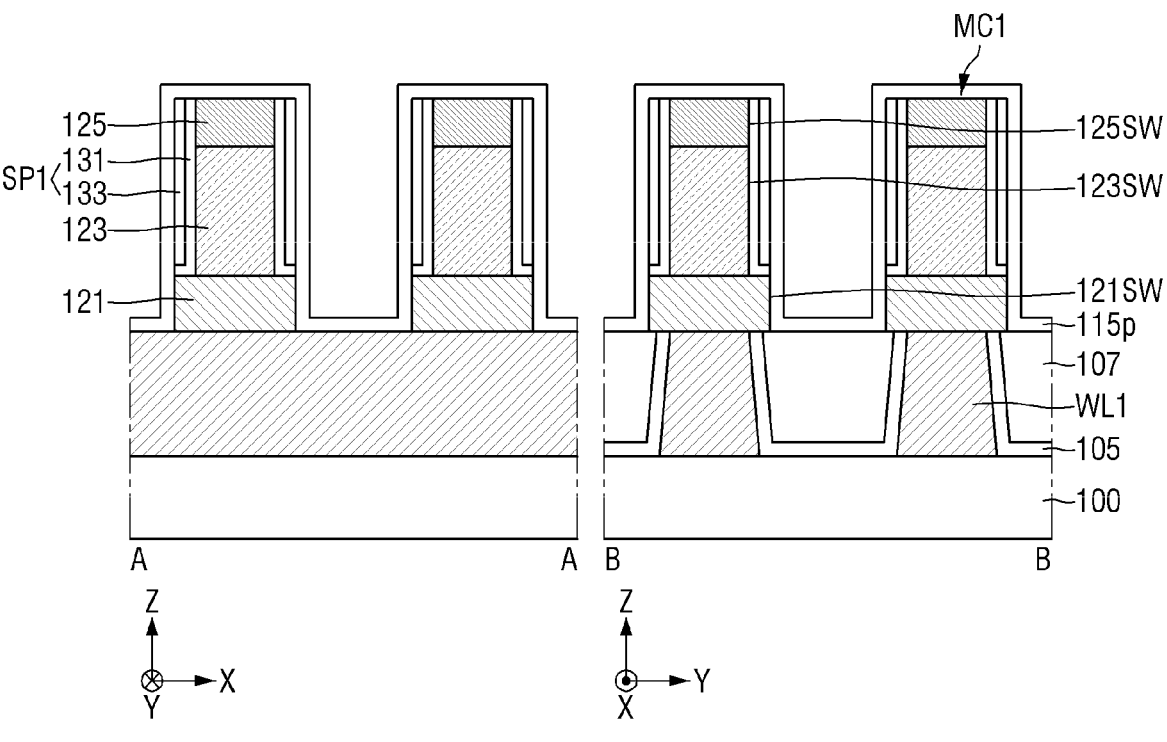

Referring to FIG. 18, a pre-first capping liner film 115p may be formed along one or more side walls of the first spacer SP1, one or more side walls 121SW of the first electrode 121, the upper surface of the first conductive line WL1, and the upper surfaces of the first interlayer filling film 107. The pre-first capping liner film 115p may be placed along the upper surface of the second electrode 125.

The pre-first capping liner film 115p may include, for example, but not limited to, silicon nitride (SiN).

Figure 19:
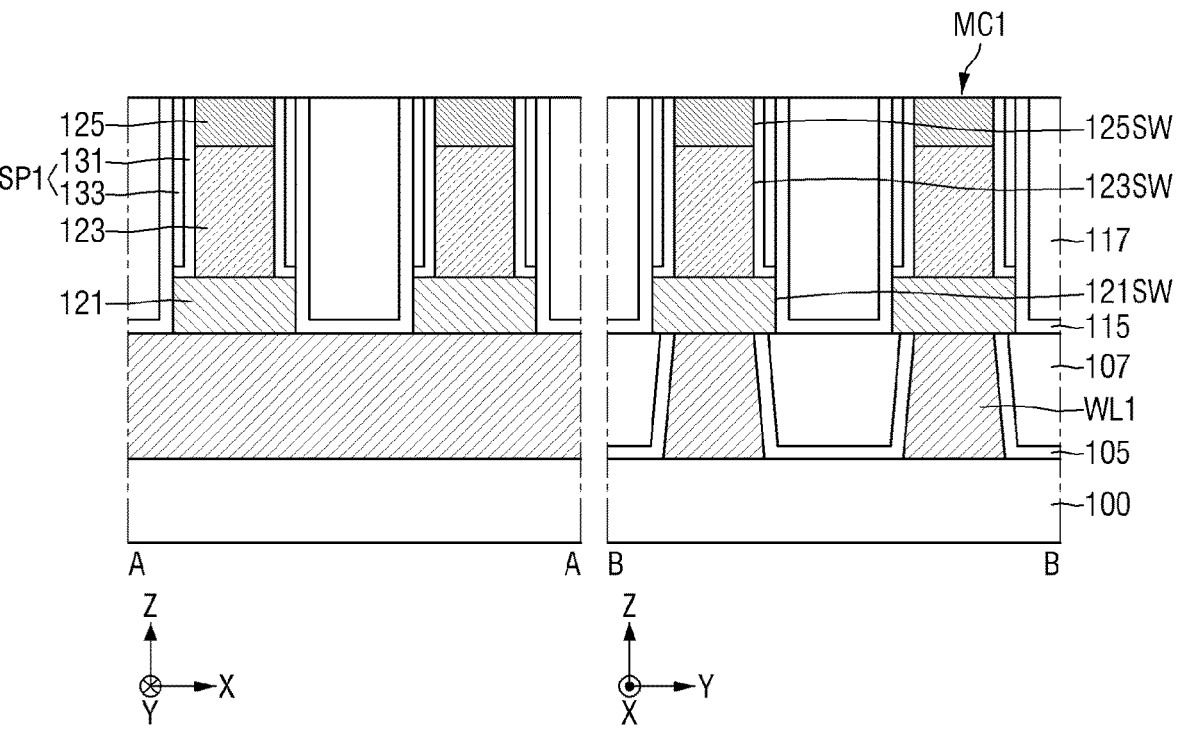

Referring to FIG. 19, the first capping liner film 115 and the first gap fill film 117 may be formed. The first capping liner film 115 may be formed by removing a portion of the pre-first capping liner film 115p. The upper surface of the second electrode 125 may be exposed by removing the pre-first capping liner film 115p. The first gap fill film 117 may be formed on the first capping liner film 115.

Figure 20:
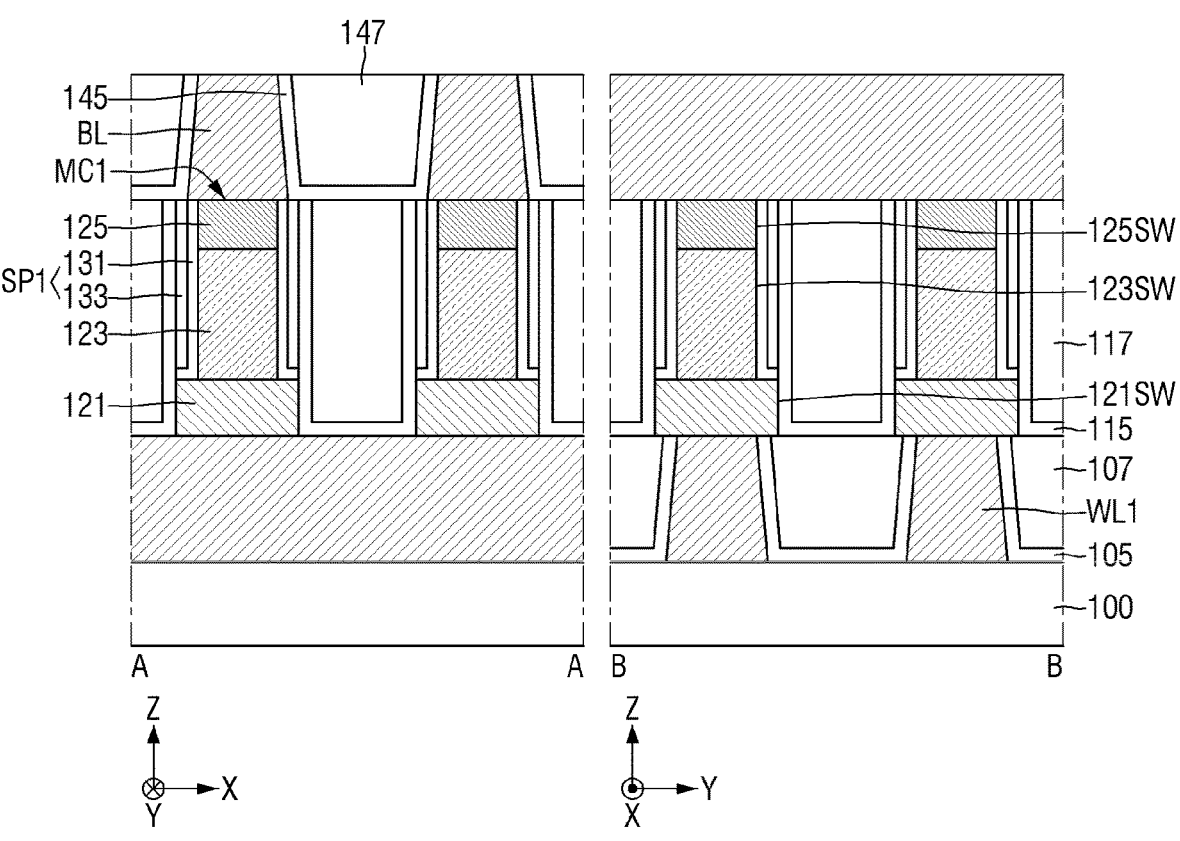

Referring to FIG. 20, the second conductive line BL may be formed on the first memory cell MC1 and the first gap fill film 117.

The second conductive line BL may extend in the second direction Y. Each second conductive line BL may be spaced apart in the first direction X from each other. The second interlayer liner film 145 and the second interlayer filling film 147 may be formed between each second conductive line BL.

The processes of FIGS. 13 to 20 may be repeated to form the second memory cell MC2 and the third conductive line WL2. Accordingly, a semiconductor memory device having improved performance and reliability can be fabricated.

In concluding the detailed description, those skilled in the art will appreciate that many variations and modifications may be made to the example embodiments without substantially departing from the scope of the invention. Therefore, the disclosed example embodiments of the disclosure are used in a generic and descriptive sense only and not for purposes of limitation.

What is claimed is:

1. A semiconductor memory device comprising:
   a substrate;
   a first conductive line extending in a first horizontal direction parallel to an upper surface of the substrate, on the substrate;
   a memory cell on the first conductive line, wherein the memory cell comprises a first electrode, an information storage pattern on the first electrode, and a second electrode on the information storage pattern;
   a second conductive line extending in a second horizontal direction parallel to the upper surface of the substrate, on the second electrode;
   a spacer on a side wall of the memory cell, and
   a capping liner film on a side wall of the spacer and the side wall of the first electrode,
   wherein side walls of the first electrode are free of having the spacer thereon,
   wherein the first horizontal direction intersects with the second horizontal direction,
   wherein a width of an upper surface of the first electrode in the first horizontal direction is greater than a width of a lower surface of the information storage pattern in the first horizontal direction, and
   wherein the second electrode and the information storage pattern are free of having contact with the capping liner film.

2. The semiconductor memory device of claim 1, wherein the spacer includes a first sub-spacer and a second sub-spacer, and
   the first sub-spacer and the second sub-spacer include different materials from each other.

3. The semiconductor memory device of claim 2, wherein the first sub-spacer is on a side wall of the second electrode and a side wall of the information storage pattern,
   the second sub-spacer is on the first sub-spacer,
   the first sub-spacer includes a nitride-based insulating material, and
   the second sub-spacer includes an oxide-based insulating material.

4. The semiconductor memory device of claim 3, wherein the first sub-spacer includes a portion whose width in the first horizontal direction increases with increased distance from the substrate.

5. The semiconductor memory device of claim 3, wherein the first sub-spacer is on the upper surface of the first electrode, and the first electrode is free of having contact with the second sub-spacer.

6. The semiconductor memory device of claim 3, wherein a width of the second sub-spacer in the first horizontal direction is constant.

7. The semiconductor memory device of claim 1, wherein a width of an upper surface of the information storage pattern in the first horizontal direction is less than a width of a lower surface of the second electrode in the first horizontal direction.

8. The semiconductor memory device of claim 1, wherein a logic state of data stored in the information storage pattern is based on polarity of a program voltage.

9. A semiconductor memory device comprising;
a substrate;
a first conductive line extending in a first horizontal direction parallel to an upper surface of the substrate, on the substrate;
a first electrode on the first conductive line;
an information storage pattern on the first electrode;
a second electrode on the information storage pattern;
a second conductive line extending in a second horizontal direction parallel to the upper surface of the substrate, on the second electrode;
a first sub-spacer on a side wall of the information storage pattern, a side wall of the second electrode, and an upper surface of the first electrode; and
a second sub-spacer on the first sub-spacer,
wherein a surface area of the upper surface of the first electrode is greater than a surface area of a bottom surface of the information storage pattern,
wherein a surface area of a bottom surface of the second electrode is greater than a surface area of an upper surface of the information storage pattern,
wherein the first and second sub-spacers include different materials from each other, and
wherein the first electrode is free of having contact with the second sub-spacer.

10. The semiconductor memory device of claim 9, wherein the second sub-spacer includes a first portion closer to the first electrode, and a second portion closer to the second electrode, and
wherein a width of the first portion in the first horizontal direction is greater than a width of the second portion in the first horizontal direction.

11. The semiconductor memory device of claim 9, wherein the first sub-spacer includes a portion whose width in the first horizontal direction increases with increased distance from the substrate.

12. The semiconductor memory device of claim 9, further comprising:
a capping liner film on a side wall of the first sub-spacer, a side wall of the second sub-spacer, and a side wall of the first electrode.

13. The semiconductor memory device of claim 12, wherein the second electrode and the information storage pattern are free of having contact with the capping liner film.

14. The semiconductor memory device of claim 9, wherein the first sub-spacer includes a nitride-based insulating material, and
the second sub-spacer includes an oxide-based insulating material.

15. A semiconductor memory device comprising:
a substrate;

a first conductive line extending in a first horizontal direction parallel to an upper surface of the substrate, on the substrate;
a first memory cell on the first conductive line, wherein the first memory cell comprises a first electrode on the first conductive line, a first information storage pattern on the first electrode, and a second electrode on the first information storage pattern;
a second conductive extending in a second horizontal direction parallel to the upper surface of the substrate, on the second electrode;
a first spacer on a side wall of the first memory cell;
a third conductive line extending in the first horizontal direction, on the second electrode;
a second memory cell on the third conductive line, wherein the second memory cell comprises a third electrode on the third conductive line, a second information storage pattern on the third electrode, and a fourth electrode on the second information storage pattern; and
a second spacer on a side wall of the second memory cell,
wherein a side wall of the first electrode is free of having the first spacer thereon,
wherein a width of an upper surface of the first electrode in the first horizontal direction is greater than a width of a bottom surface of the first information storage pattern in the first horizontal direction,
wherein a side wall of the third electrode is free of having the second spacer thereon,
wherein a width of an upper surface of the third electrode in the first horizontal direction is greater than a width of a bottom surface of the second information storage pattern in the first horizontal direction, and
wherein the first spacer includes a first sub-spacer and a second sub-spacer, the second spacer includes a third sub-spacer and a fourth sub-spacer, the first sub-spacer and the third sub-spacer each include a first insulating material, and the second sub-spacer and the fourth sub-spacer each include a second insulating material different from the first insulating material.

16. The semiconductor memory device of claim 15, further comprising:
a capping liner film on a side wall of the first spacer and the side wall of the first electrode.

17. The semiconductor memory device of claim 16, wherein the second electrode and the first information storage pattern are free of having contact with the capping liner film.

18. The semiconductor memory device of claim 15, wherein the first electrode is free of having contact with the second sub-spacer, and the third electrode is free of having contact with the fourth sub-spacer.

19. The semiconductor memory device of claim 15, wherein
the first sub-spacer and the third sub-spacer each include a nitride-based insulating material, and
the second sub-spacer and the fourth sub-spacer each include an oxide-based insulating material.

20. The semiconductor memory device of claim 19, wherein each of the first sub-spacer and the third sub-spacer includes a portion whose width in the first horizontal direction increases with increased distance from the substrate.

* * * * *